United States Patent
Snyder et al.

(10) Patent No.: US 8,058,167 B2
(45) Date of Patent: Nov. 15, 2011

(54) DYNAMIC SCHOTTKY BARRIER MOSFET DEVICE AND METHOD OF MANUFACTURE

(75) Inventors: John P. Snyder, Edina, MN (US); John M. Larson, Northfield, MN (US)

(73) Assignee: Avolare 2, LLC, Chapel Hill, NC (US)

( * ) Notice: Subject to any disclaimer, the term of this patent is extended or adjusted under 35 U.S.C. 154(b) by 0 days.

(21) Appl. No.: 12/568,655

(22) Filed: Sep. 28, 2009

(65) Prior Publication Data
US 2010/0015802 A1    Jan. 21, 2010

Related U.S. Application Data

(60) Continuation of application No. 11/543,631, filed on Oct. 5, 2006, now abandoned, which is a division of application No. 10/970,688, filed on Oct. 21, 2004, now abandoned.

(60) Provisional application No. 60/513,410, filed on Oct. 22, 2003, provisional application No. 60/514,041, filed on Oct. 24, 2003.

(51) Int. Cl.
H01L 21/44 (2006.01)
(52) U.S. Cl. .. 438/664; 438/655; 438/651; 257/E21.159
(58) Field of Classification Search .................. 438/664, 438/655, 651; 257/E21.159
See application file for complete search history.

(56) References Cited

U.S. PATENT DOCUMENTS

| | | |
|---|---|---|
| 5,338,698 A | 8/1994 | Subbanna |
| 6,091,076 A | 7/2000 | Deleonibus |
| 6,255,704 B1 | 7/2001 | Iwata et al. |
| 6,303,479 B1 | 10/2001 | Snyder |
| 6,420,763 B1 | 7/2002 | Yamashita et al. |
| 6,974,737 B2 | 12/2005 | Snyder et al. |
| 7,057,302 B2 | 6/2006 | Matsuzawa et al. |
| 7,294,889 B2 | 11/2007 | Jung |
| 2004/0026736 A1 | 2/2004 | Grupp et al. |

FOREIGN PATENT DOCUMENTS

| | | |
|---|---|---|
| EP | 0902476 A1 | 3/1999 |
| JP | 06097109 | 4/1994 |
| JP | 2000124329 | 4/2000 |
| WO | WO 03-015181 A1 | 2/2003 |

OTHER PUBLICATIONS

PCTUS0315367 S.R., Dec. 16, 2003, WIPO Search Report for priority app PCT/US03/15367.
PCTUS0640063 S.R., Dec. 10, 2006, WIPO Search Report for priority app PCT/US06/40063.
Dubois, E., et al., "Low Schottky Barrier Source/Drain for Advanced MOS Architecture: Device Design and Material Considerations", "Solid State Electronics", 2002, pp. 997-1004, vol. 46.

(Continued)

*Primary Examiner* — Tom Thomas
*Assistant Examiner* — Matthew Reames
(74) *Attorney, Agent, or Firm* — Daivd J. King; Charles A. Lemaire; Lemaire Patent Law Firm, P.L.L.C.

(57) ABSTRACT

A device for regulating a flow of electric current and its manufacturing method are provided. The device includes metal-insulator-semiconductor source-drain contacts forming Schottky barrier or Schottky-like junctions to the semiconductor substrate. The device includes an interfacial layer between the semiconductor substrate and a metal source and/or drain electrode, thereby dynamically adjusting a Schottky barrier height by applying different bias conditions. The dynamic Schottky barrier modulation provides increased electric current for low drain bias conditions, reducing the sub-linear turn-on characteristic of Schottky barrier MOSFET devices and improving device performance.

21 Claims, 17 Drawing Sheets

OTHER PUBLICATIONS

Guo et al., "A Computational Study of Thin-Body, Double-Gate, Schottky Barrier MOSFETs", "IEEE Transactions on Electron Devices", Nov. 2002, pp. 1897-1902, vol. 49, No. 11.

Hsieh et al., "A Field-Funneling Effect on the Collection of Alpha-Particle-Generated Carriers in Silicon Devices", "IEEE Electron Device Letters", 1981, p. 103, vol. 2, No. 4.

Ikeda, "50-nm Gate Schottky Source/Drain p-MOSFETs With a SiGe Channel", "IEEE Electron Device Letters", Nov. 2002, pp. 670-672, vol. 23, No. 11.

Kedzierski et al., "Complementary Silicide Source/Drain Thin-body MOSFETs for the 20mm Gate Length Regime", "IEDM", 2000, pp. 57-60.

Kenichi, Osada, et al., "Analysis of SRAM Neutron-Induced Errors Based on the Consideration of Both Charge-Collection and Parasitic-Bipolar Failu", "IEEE 2004 Custom Integrated Circuits Conference", 2004, p. 357.

Tao et al., "Low Schottky Barriers on n-type Silicon (001)", "Applied Physics Letters", 2003, pp. 2593-2595, vol. 83, No. 13.

Ng, Wai Tung et al., "A CMOS-Compatible complementary SINFET HVIC Process", "IEEE Transactions of Electronic Devices", Aug. 1991, pp. 1935-1942, vol. 38, No. 8.

Winstead, B., et al., "Simulation of Schottky Barrier MOSFET's with a Coupled Quantum Infection/Monte Carol Technique", "IEEE Transactions on Electron Device", Jun. 2000, pp. 1241-1246, vol. 47, No. 6.

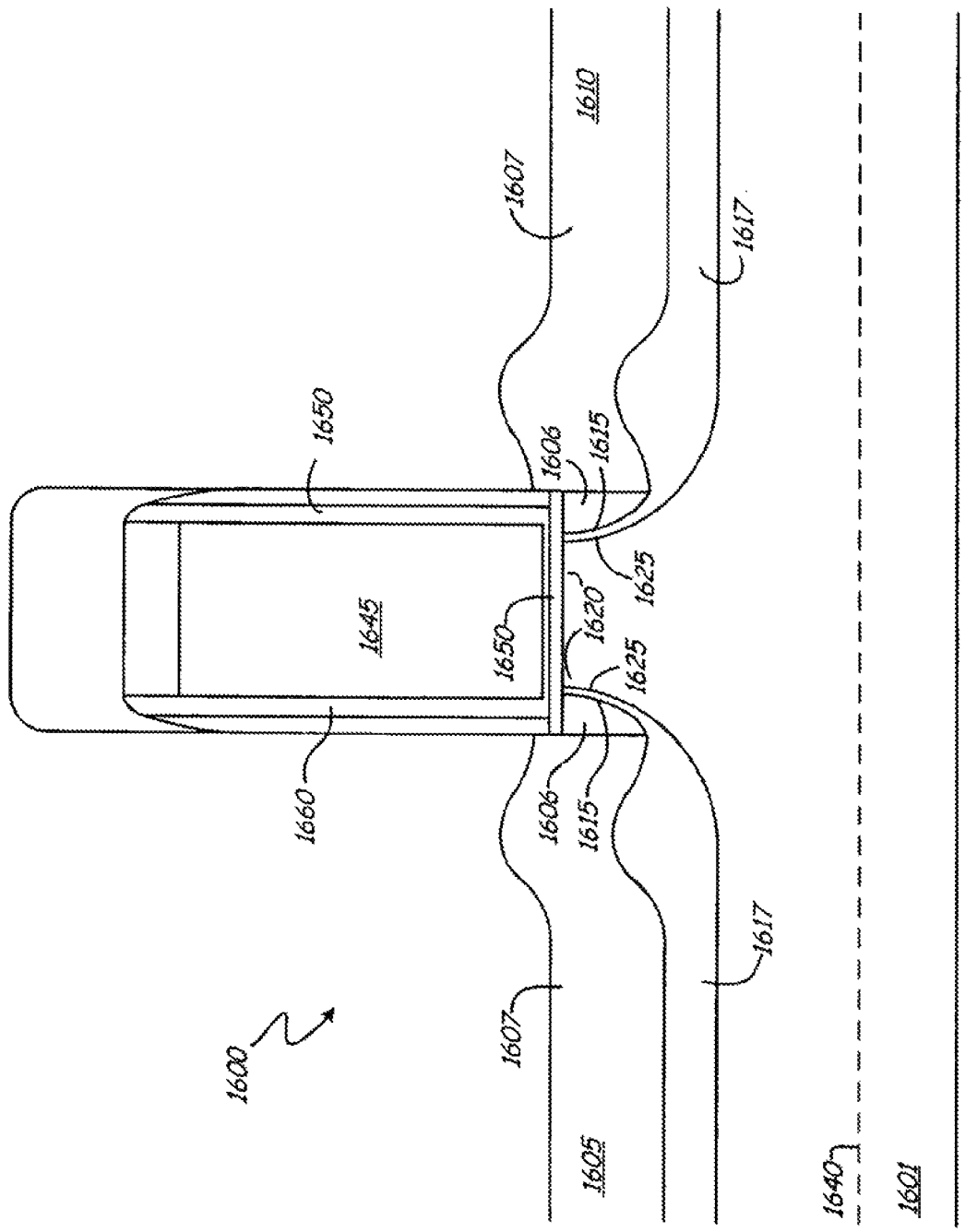

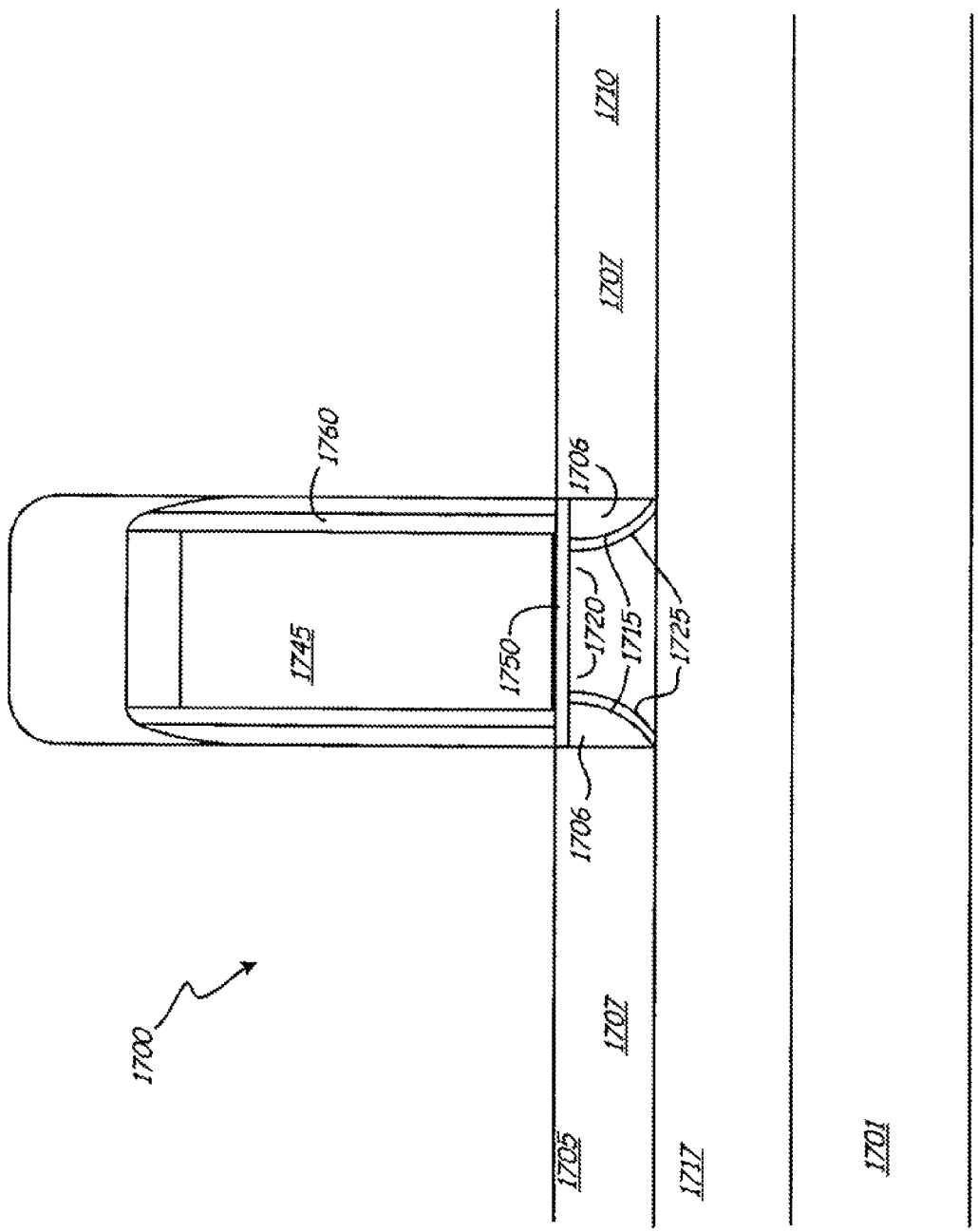

DYNAMIC SCHOTTKY BARRIER MOSFET DEVICE AND METHOD OF MANUFACTURE

CROSS-REFERENCE TO RELATED APPLICATIONS

This application is a continuation application of U.S. patent application Ser. No. 11/543,631, filed Oct. 5, 2006, which is a divisional application of U.S. patent application Ser. No. 10/970,688, filed Oct. 21, 2004, which claimed the benefit of and priority to U.S. Provisional Patent Application No. 60/513,410, filed Oct. 22, 2003, and also claimed the benefit of and priority to U.S. Provisional Patent Application No. 60/514,041, filed Oct. 24, 2003. Each of the above provisional and non-provisional patent applications is incorporated by reference herein in their entirety.

FIELD OF THE INVENTION

The present invention relates to devices for regulating the flow of electric current, and has specific application to the fabrication of these devices in the context of an integrated circuit ("IC"). More particularly, it relates to a transistor for regulating the flow of electric current having metal source and/or drains forming Schottky-barrier or Schottky-like contacts to a channel region.

BACKGROUND OF THE INVENTION

One type of transistor known in the art is a Schottky-barrier metal oxide semiconductor field effect transistor (Schottky-barrier MOSFET or SBMOS). As shown in FIG. 1, the SB-MOS device 100 comprises a semiconductor substrate 110 in which a source electrode 120 and a drain electrode 125 electrode are formed, separated by a channel region 140 having channel dopants. The channel region 140 is the current-carrying region of the substrate 110. For purposes of the present invention, the channel region 140 in the semiconductor substrate extends vertically below the gate insulator 150 to a boundary approximately aligned with the bottom edge of the source 120 and bottom edge of the drain 125 electrodes. The channel dopant concentration profile typically has a maximum concentration 115, which is below the source 120 and drain 125 electrodes, and thus outside of the channel region 140. For the purpose of the present invention, channel dopants are not constrained to be provided exclusively within the channel region 140, but may be found in regions substantially outside of the channel region 140.

For a SB-MOS device at least one of the source 120 or the drain 125 contacts is composed partially or fully of a metal silicide. Because at least one of the source 120 or the drain 125 contacts is composed in part of a metal, they form Schottky or Schottky-like contacts 130,135 with the substrate 110 and the channel region 140. A Schottky contact is defined as a contact formed by the intimate contact between a metal and a semiconductor, and a Schottky-like contact is defined as a contact formed by the close proximity of a semiconductor and a metal. The Schottky contacts or Schottky-like contacts or junctions 130, 135 may be provided by forming the source 120 or the drain 125 from a metal silicide. The channel length is defined as the distance from the source 120 contact to the drain 125 contact, laterally across the channel region 140.

The Schottky or Schottky-like contacts 130, 135 are located in an area adjacent to the channel region 140 formed between the source 120 and drain 125. An insulating layer 150 is located on top of the channel region 140. The insulating layer 150 is composed of a material such as silicon dioxide. The channel region 140 extends vertically from the insulating layer 150 to the bottom of the source 120 and drain 125 electrodes. A gate electrode 160 is positioned on top of the insulating layer 150, and a thin insulating layer 170 surrounds the gate electrode 160. The thin insulating layer 170 is also known as the spacer. The gate electrode 160 may be doped poly silicon. The source 120 and drain 125 electrodes may extend laterally below the spacer 170 and gate electrode 160. A field oxide 190 electrically isolates devices from one another. An exemplary Schottky-barrier device is disclosed in Spinnaker's U.S. Pat. No. 6,303,479.

Another type of MOSFET transistor known in the art is a conventional impurity-doped source-drain transistor or conventional MOSFET. This device is similar to the SB-MOS device shown in FIG. 1. The key difference is that the metal source-drain regions 120,125 of the SB-MOS are replaced with impurity doping in the semiconductor substrate for the conventional MOSFET.

One of the important performance characteristics for a MOSFET device is the drive current ($I_d$), which is the electrical current from source to drain when the applied source voltage ($V_s$) is grounded, and the gate ($V_g$) and drain ($V_d$) are biased at the supply voltage ($V_{dd}$). Drive current is one of the important parameters that determines circuit performance. For example, the switching speed of a transistor scales as $I_d$, so that higher drive current devices switch faster, thereby providing higher performance integrated circuits.

FIG. 2 shows the relationship of drive current ($I_d$) 232 for varying gate voltage ($V_g$) and drain voltage ($V_d$) 231 for a SB-MOS and a conventional MOSFET. One characteristic of SB-MOS device $I_d$-$V_d$ curves is the sub-linear shape for low $V_d$ 231, as shown by the solid lines 210,215,220,225,230. Each of the $I_d$-$V_d$ curves 210,215,220,225,230 has a different $V_g$. The $I_d$-$V_d$ profile at low $V_d$ is known as the turn-on characteristic. Conventional MOSFET transistor technologies have a linear $I_d$-$V_d$ turn-on characteristic at low $V_d$, as shown by the dashed lines 235,240,245,250,255 in FIG. 2. Each of the $I_d$-$V_d$ curves 235,240,245,250,255 has a different $V_g$. The sub-linear $I_d$-$V_d$ turn-on characteristic of the SB-MOS device increases as the channel length decreases and can potentially reduce transistor performance, possibly reducing the effective switching speed of the device for example. Sub-linear turn-on has been observed in the literature and referenced as a reason why SB-MOS devices will not be of practicable use in integrated circuits (B. Winstead et al., IEEE Transactions on Electron Devices, 2000, pp. 1241-1246). Industry literature consistently teaches that the Schottky barrier height $\phi_b$ should be reduced or made less than zero in order to minimize the sub-linear turn-on phenomenon and thus to make SB-MOS device performance competitive with alternative MOSFET device technologies (J. Kedzierski et al., IEDM, 2000, pp. 57-60; E. Dubois et al., Solid State Electronics, 2002, pp. 997-1004; J. Guo et al., IEEE Transaction on Electron Devices, 2002, pp. 1897-1902; K. Ikeda et al., IEEE Electronic Device Letters, 2002, pp. 670-672; M. Tao et al., Applied Physics Letters, 2003, pp. 2593-2595).

There is a need in the industry for teaching a SB-MOS device and method of fabrication that provides a means for improving the turn-on characteristic thereby providing improved performance.

BRIEF SUMMARY OF THE INVENTION

In one aspect, the present invention provides a method of fabricating a Schottky barrier MOSFET (SB-MOS) device wherein at least one of the source and drain contact regions is comprised of a metal and wherein the SBMOS device includes an interfacial layer located between at least one of the metal source or drain electrodes and the semiconductor substrate, thereby forming a Schottky or Schottky-like contact. In one embodiment of the present invention, the interfacial layer is comprised of a conducting, semiconducting, or insulating material.

While multiple embodiments are disclosed, still other embodiments of the present invention will become apparent to those skilled in the art from the following detailed description, which shows and describes illustrative embodiments of the invention. As will be realized, the invention is capable of modifications in various obvious aspects, all without departing from the spirit and scope of the present invention. Accordingly, the drawings and detailed description are to be regarded as illustrative in nature and not restrictive.

BRIEF DESCRIPTION OF THE DRAWINGS

FIG. 16 illustrates a cross-sectional view of another exemplary embodiment of the present invention process using a metal-insulator-semiconductor (MIS) source-drain SB-MOS device.

FIG. 17 illustrates a cross-sectional view of yet another exemplary embodiment of the present invention process using a metal-insulator-semiconductor (MIS) source-drain SB-MOS device.

DETAILED DESCRIPTION

In general, the present invention provides method of fabrication of SB-MOS devices. In one embodiment of the present invention, the method includes providing a semiconductor substrate and doping the semiconductor substrate and channel region. The method further includes providing a first electrically insulating layer in contact with the semiconductor substrate. The method further includes providing a gate electrode on the first insulating layer, providing a second insulating layer around the gate electrode including the gate electrode sidewalls, and exposing the substrate on one or more areas proximal to the gate electrode. In the present invention, the term proximal is defined as being located within a lateral distance away of approximately 500 Å from one or more said objects. For example, in the previous sentence, the substrate is exposed in one or more areas proximal to the gate electrode, or the one or more areas are located within a lateral distance away of approximately 500 Å from the gate electrode. The method further includes etching of the exposed areas proximal to the gate electrode using a partially isotropic etch. The method further includes providing an interfacial layer on the exposed semiconductor substrate at least in areas proximal to the gate electrode and first insulating layer, the interfacial layer comprising a conducting, semiconducting, or insulating material, but preferably an insulating material. The method further includes using an anisotropic etch to expose the semiconductor substrate in areas proximal but not below the gate electrode and providing an insulating layer on the gate electrode sidewalls. The method further includes depositing a thin film of metal and reacting the metal with the exposed substrate, such that a metal silicide forms on the substrate. The method further includes removing any unreacted metal.

One of the advantages of the present invention is that the metal source and drain electrodes provide significantly reduced parasitic series resistance ($\sim 10\Omega$-$\mu$m) and contact resistance (less than $10^{-8}$ $\Omega$-cm$^2$). The built-in Schottky barrier at the Schottky contacts provides superior control of off-state leakage current. The device substantially eliminates parasitic bipolar action, making it unconditionally immune to latch-up, snapback effects, and multi-cell soft errors in memory and logic. Elimination of bipolar action also significantly reduces the occurrence of other deleterious effects related to parasitic bipolar action such as single event upsets and single cell soft errors. The device of the present invention is easily manufacturable, requiring two fewer masks for source/drain formation, no shallow extension or deep source/drain implants, and a low temperature source/drain formation process. Due to low temperature processing, integration of new, potentially key materials such as high K gate insulators, strained silicon and metal gates is made easier.

Figure 1:
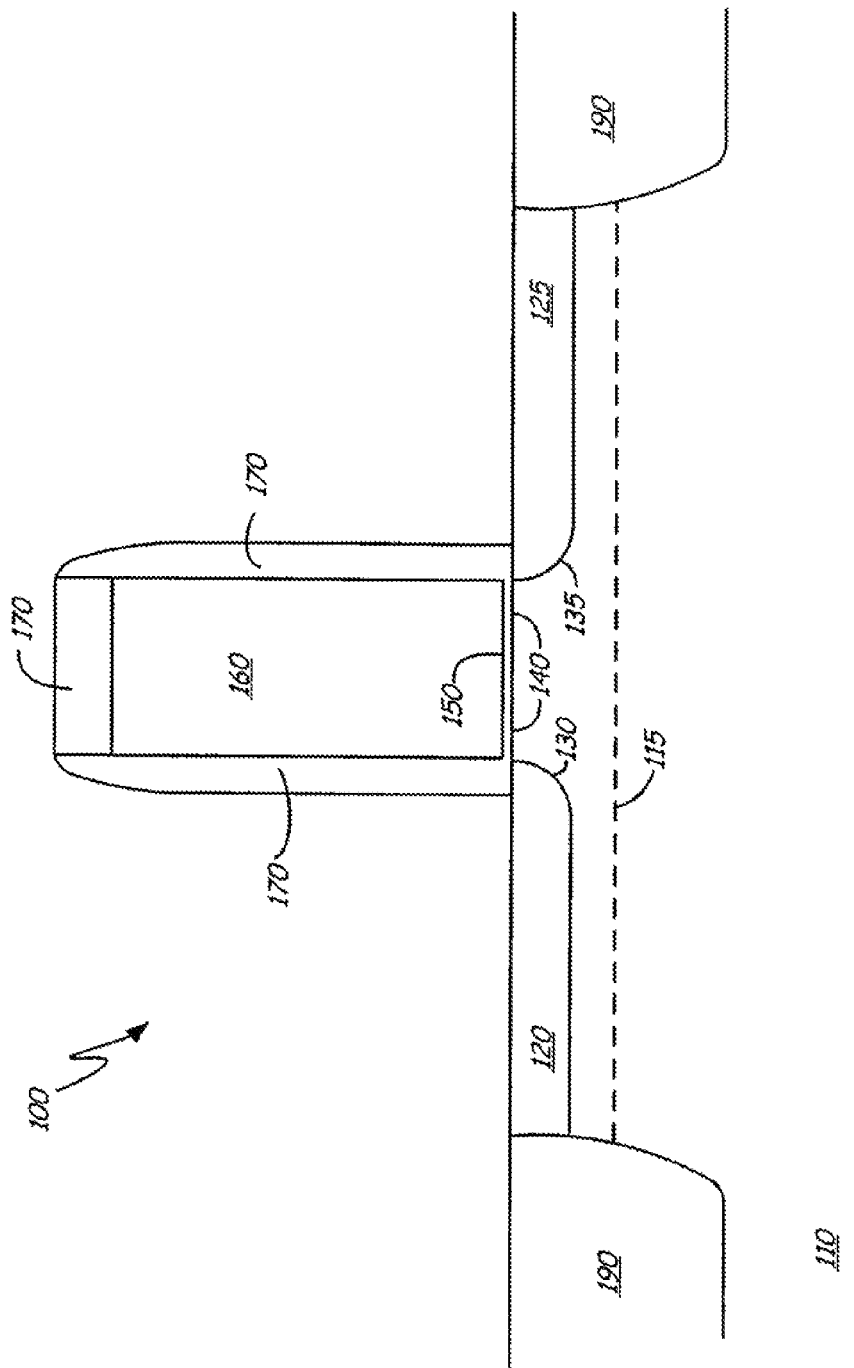
FIG. 1 illustrates a sectional view of a prior art Schottky-barrier metal oxide semiconductor field effect transistor ("MOSFET")
Figure 2:
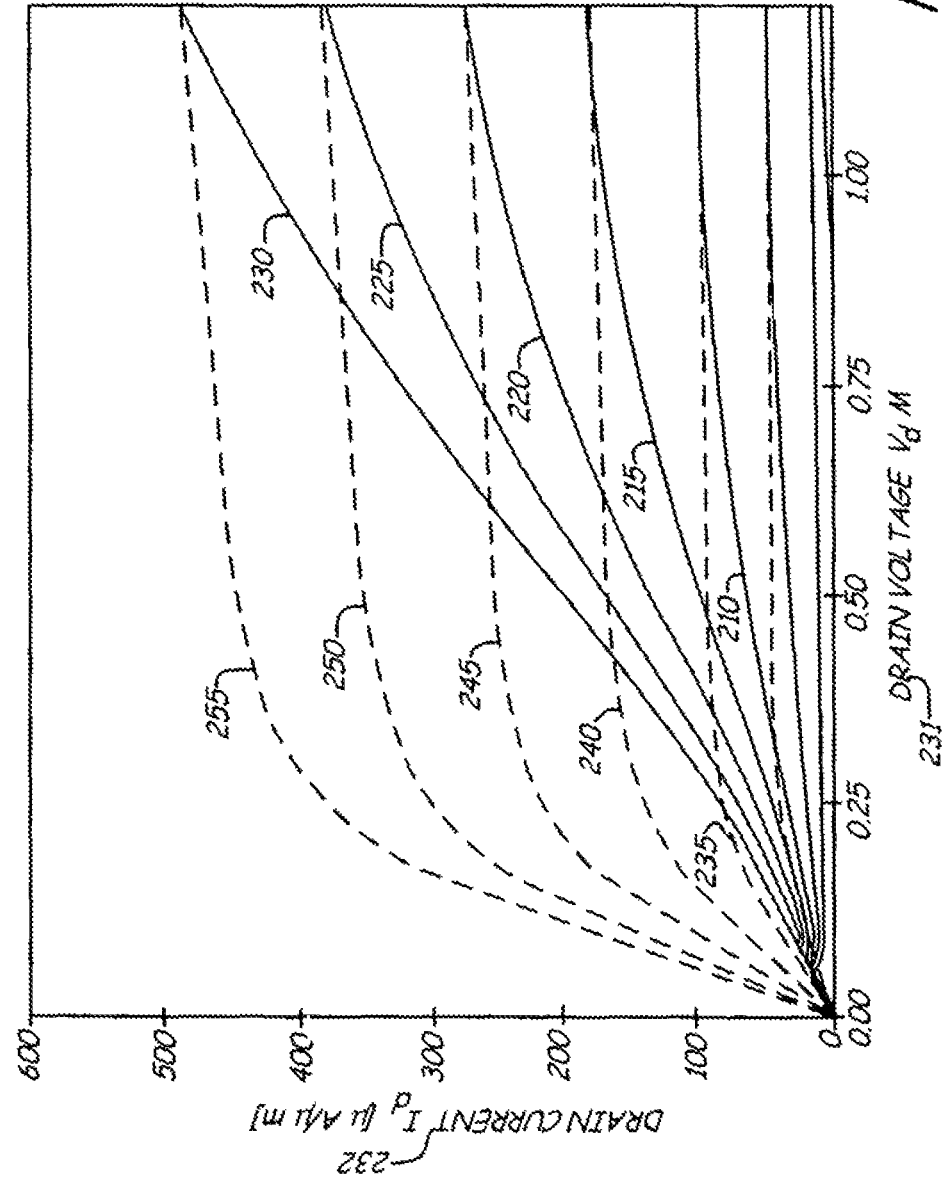
FIG. 2 illustrates transistor curves for a SB-MOS device and an impurity doped source-drain MOSFET device.
Figure 3:
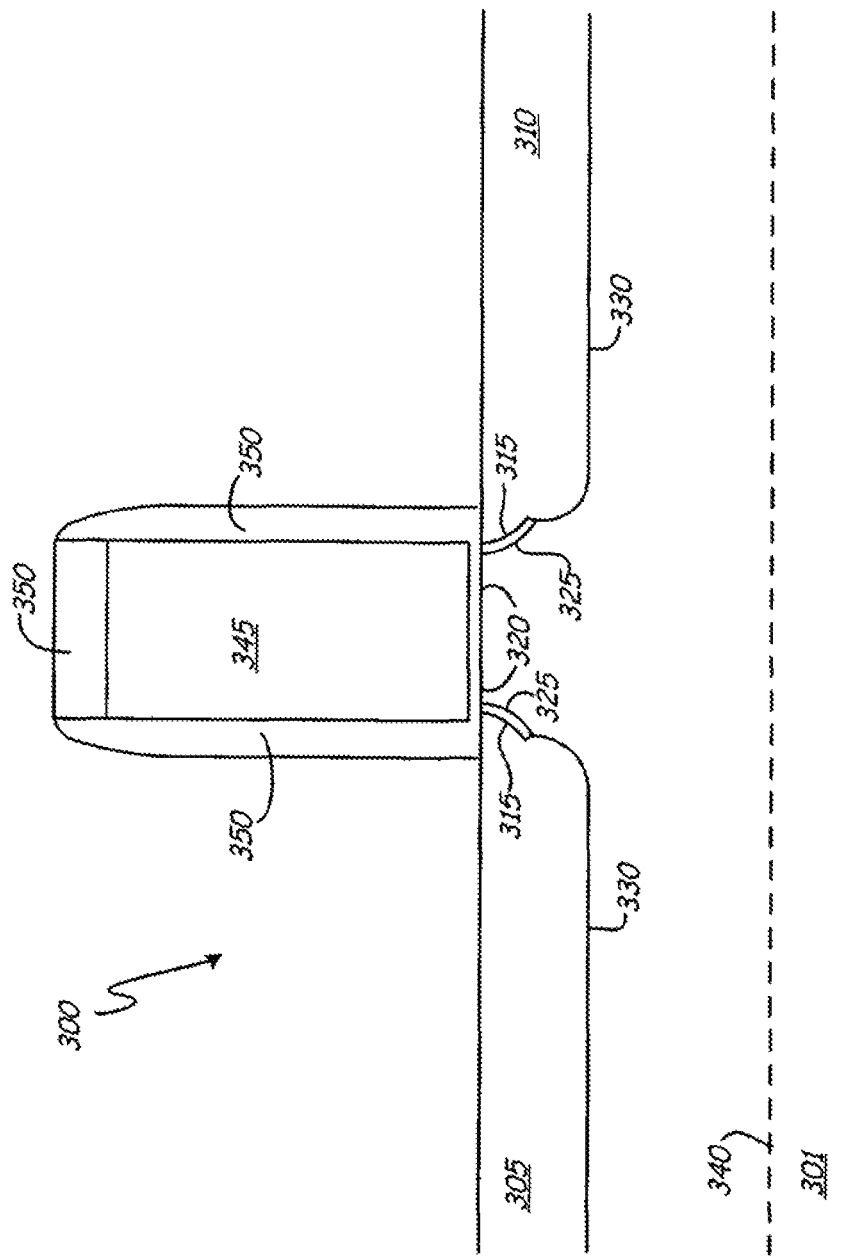
FIG. 3 illustrates a sectional view of an exemplary embodiment of the present invention metal-insulator-semiconductor (MIS) source-drain SB-MOS device.

FIG. 3 shows a cross-sectional view of a preferred exemplary embodiment of the present invention, as exemplified by a metal-insulator-semiconductor (MIS) source-drain SB-MOS structure 300. This embodiment comprises a SB-MOS device in which at least one of the source 305 or drain 310 regions consist of metal, so that there is no doping in the source and/or drain regions. In this embodiment, the device includes an interfacial layer 315, comprised of a conducting, semiconducting, or insulating material, placed between at least one of the metal source 305 or drain 310 electrodes and the semiconductor substrate 301, the interfacial layer 315 being in contact with a channel region 320, thereby forming a first Schottky barrier or Schottky-like contact 325 to the channel region 320. In one preferred embodiment, the interfacial layer 315 is an insulating material. A second Schottky or Schottky-like barrier 330 is formed along the portion of the metal source 305 and/or drain 310 electrodes having direct contact between the metal and the semiconductor substrate 301. The present invention does not recognize any limitations in regards to what types of metals may be used in affecting the teachings of the present invention. Thus, metals commonly used at the transistor level, such as titanium, cobalt and the like, are specifically anticipated, as well as a plethora of more exotic metals and other alloys. Various metal silicides may also be employed, such as Platinum silicide, Palladium silicide, Iridium Silicide, and/or the rare-earth silicide, all of which should be considered as being within the scope of the teachings of the present invention. It is also noted that in another embodiment, the metal source/drain regions 305,310 may be composed of multiple layers of metals and/or metal silicides.

In one preferred embodiment, an Indium or Arsenic layer 340 is used as the channel and substrate dopants for a Schottky barrier N-type MOSFET (SB-NMOS) or a Schottky barrier P-type MOSFET (SB-PMOS) devices, respectively. These dopant atoms are used due to their relatively low rates of diffusion through the silicon lattice (compared to Phosphorous and Boron, the other two possible candidates for channel and substrate dopants). This allows for greater thermal budget during fabrication of the device, and therefore less statistical variation in the characteristics of the finished product. The present invention does not recognize any limitations in regards to what types of dopants may be used in the present invention.

In one preferred embodiment, the gate electrode 345 is fabricated from Boron or Phosphorous doped polysilicon films for the P-type and N-type devices, respectively. In this instance, Boron or Phosphorous are used due to their large solid-solubilities (compared to Arsenic and Indium). Alternatively, a metal gate may be used. In the present embodiment, the gate electrode 345 may be less than 100 nm in width (corresponding to the channel length L). The gate electrode 345 has an electrically insulating sidewall 350, which may be an oxide, a nitride, or a multi-layer stack of differing insulating materials.

Devices are separated from each other by an insulating layer (not shown), such as a thermally grown oxide (called a Field Oxide) that works in conjunction with channel and substrate dopants to electrically isolate the devices from each other. This field oxide may be provided for by a conventional process, such as a LOCOS or STI process.

Figure 4:
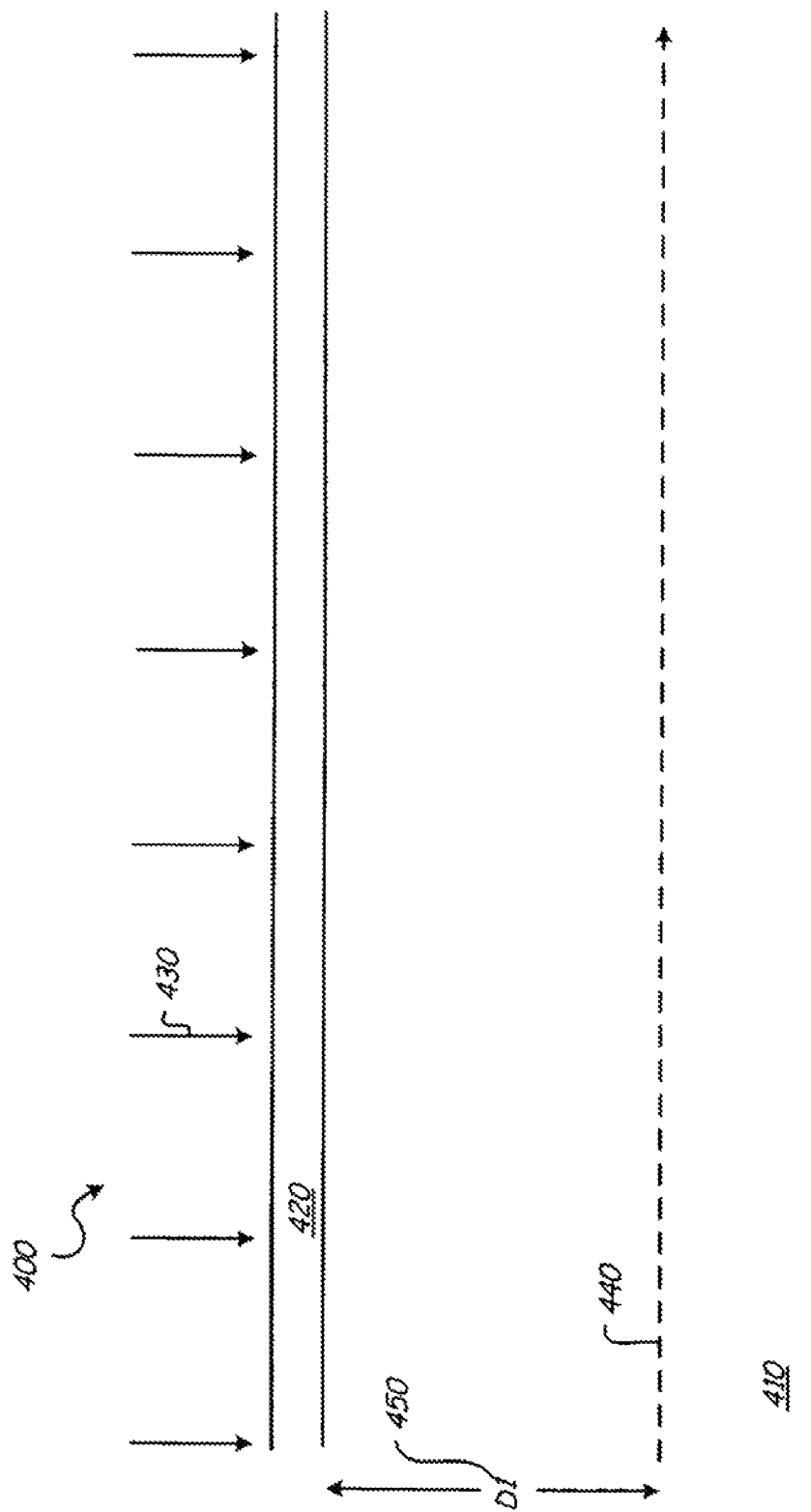
FIG. 4 illustrates an exemplary embodiment of the present invention process using implantation of the semiconductor substrate.

One exemplary process for the fabrication of a MIS source/drain SB-MOS device is illustrated in FIGS. 4-10. While this process is exemplary of the broad teachings of the present invention, it will be instructive to one skilled in the art to teach the fundamental concepts of the present invention. It is noted that this exemplary process is not limitive and that additional processes which are specifically anticipated by the present invention will be apparent to one skilled in the art. This exemplary process flow may be described as follows:

FIG. 4 shows a silicon substrate 410 that has means for electrically isolating transistors from one another. Throughout the discussion herein, there will be examples provided that make reference to a semiconductor substrate on which an SB-MOS device is formed. The present invention does not restrict the semiconductor substrate to any particular type. One skilled in the art will readily realize that many semiconductor substrates may be used for SB-MOS including silicon, silicon germanium, gallium arsenide, indium phosphide, strained semiconductor substrates, silicon on insulator, substrates of various crystallographic orientation such as <110> and <100>. In another embodiment, the silicon substrate 410 is strained. The use of a strained silicon substrate 410 in combination with a SB-MOS device results in additional improvements in power and speed performance. In another embodiment, the substrate is SOI. An SOI substrate comprises a semiconductor material, such as silicon having a thickness of approximately 20 nm to 100 nm, on a buried insulating material, such as silicon dioxide ($SiO_2$) having a thickness of approximately 100 nm to 400 nm, which is formed on a semiconductor substrate. These substrate materials and others may be used and are within the scope of the teachings of the present invention.

As shown in FIG. 4, a thin screen oxide 420 is grown on the substrate 410 to act as an implant mask. In one embodiment, the oxide is grown to a thickness of about 200 Å. The appropriate channel dopant species 430 is then ion-implanted through the screen oxide 420 such that a maximum dopant concentration 440 is provided to a pre-determined depth D1 (450) in the silicon. In one embodiment the channel dopant species is Arsenic for P-type devices and Indium for N-type devices, however any other channel dopant species commonly used at the transistor for P-type or N-type devices is specifically anticipated by the present invention. In another embodiment, the channel dopant concentration profile varies significantly in the vertical direction but is generally constant in the lateral direction. In a further embodiment, the depth D1 450 of the maximum dopant concentration is approximately 20 to 200 nm.

Figure 5:
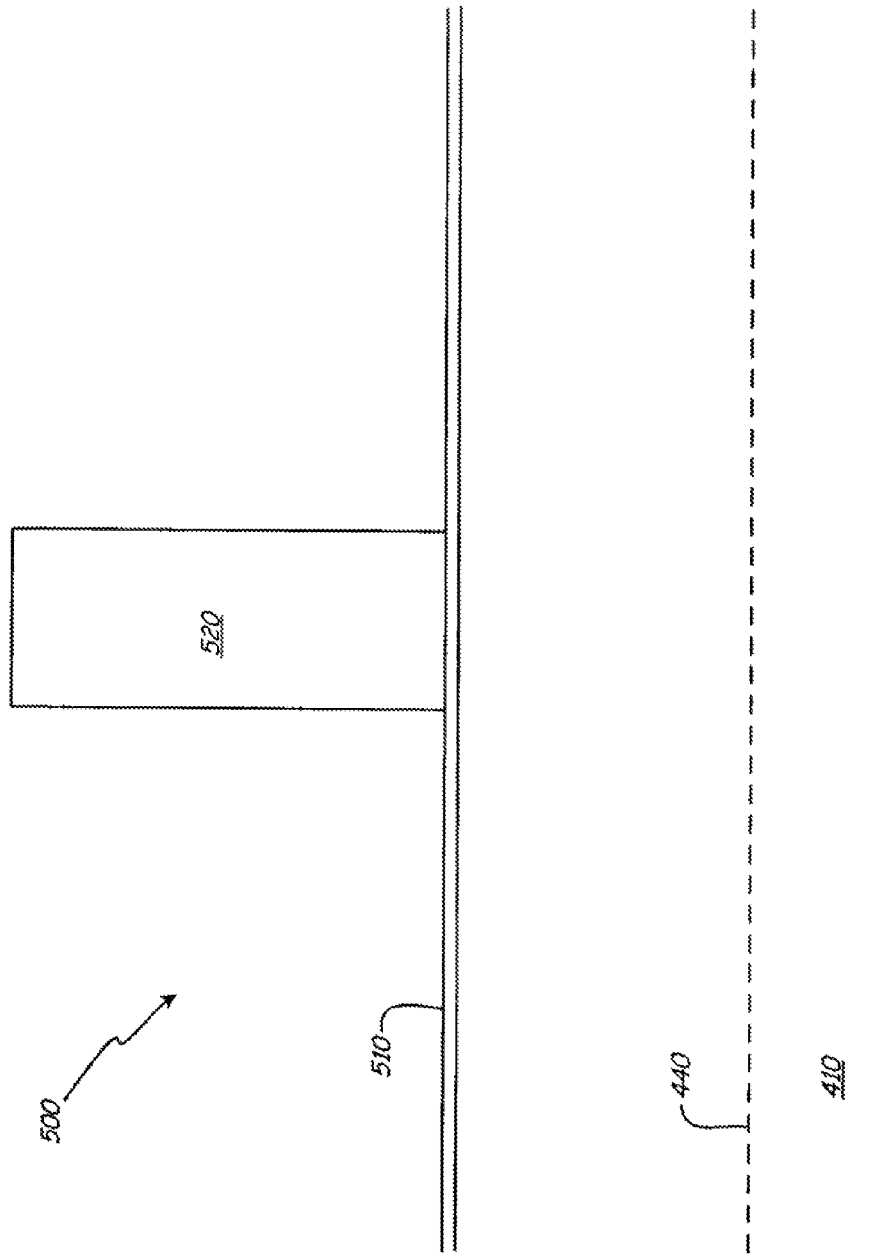
FIG. 5 illustrates an exemplary embodiment of the present invention process using a patterned silicon film on a thin gate insulator.

As shown in FIG. 5, the screen oxide is then removed in a chemical etch, and a thin gate insulator 510, such as silicon dioxide is grown. In one embodiment the screen oxide etch is comprised of hydrofluoric acid, however other chemistries commonly used to etch oxide, including both wet and dry etches, are specifically anticipated. In another embodiment, the thin gate insulator is comprised of silicon dioxide with a thickness of approximately 6 to 50 Å. In a further embodiment, a material having a high dielectric constant (high K) is provided. Examples of high K materials are those materials having dielectric constants greater than that of silicon dioxide, including for example nitrided silicon dioxide, silicon nitride, and metal oxides such as $TiO_2$, $Al_2O_3$, $La_2O_3$, $HfO_2$, $ZrO_2$, $CeO_2$, $Ta_2O_5$, $WO_3$, $Y_2O_3$, and $LaAlO_3$, and the like. The gate insulator growth is immediately followed by providing an in-situ doped silicon film. The gate insulator growth is immediately followed by providing an in-situ doped silicon film. The film is heavily doped with, for example, Phosphorous for an N-type device and Boron for a P-type device. Using lithographic techniques and a silicon etch that is highly selective to the gate insulator, the gate electrode 520 is patterned as shown in the process step 500 illustrated in FIG. 5. In another exemplary embodiment, a metal gate electrode may be provided. In another embodiment, following gate electrode patterning, additional channel dopants are provided and result in a channel dopant concentration profile that varies significantly in both the vertical and lateral directions.

Figure 6:
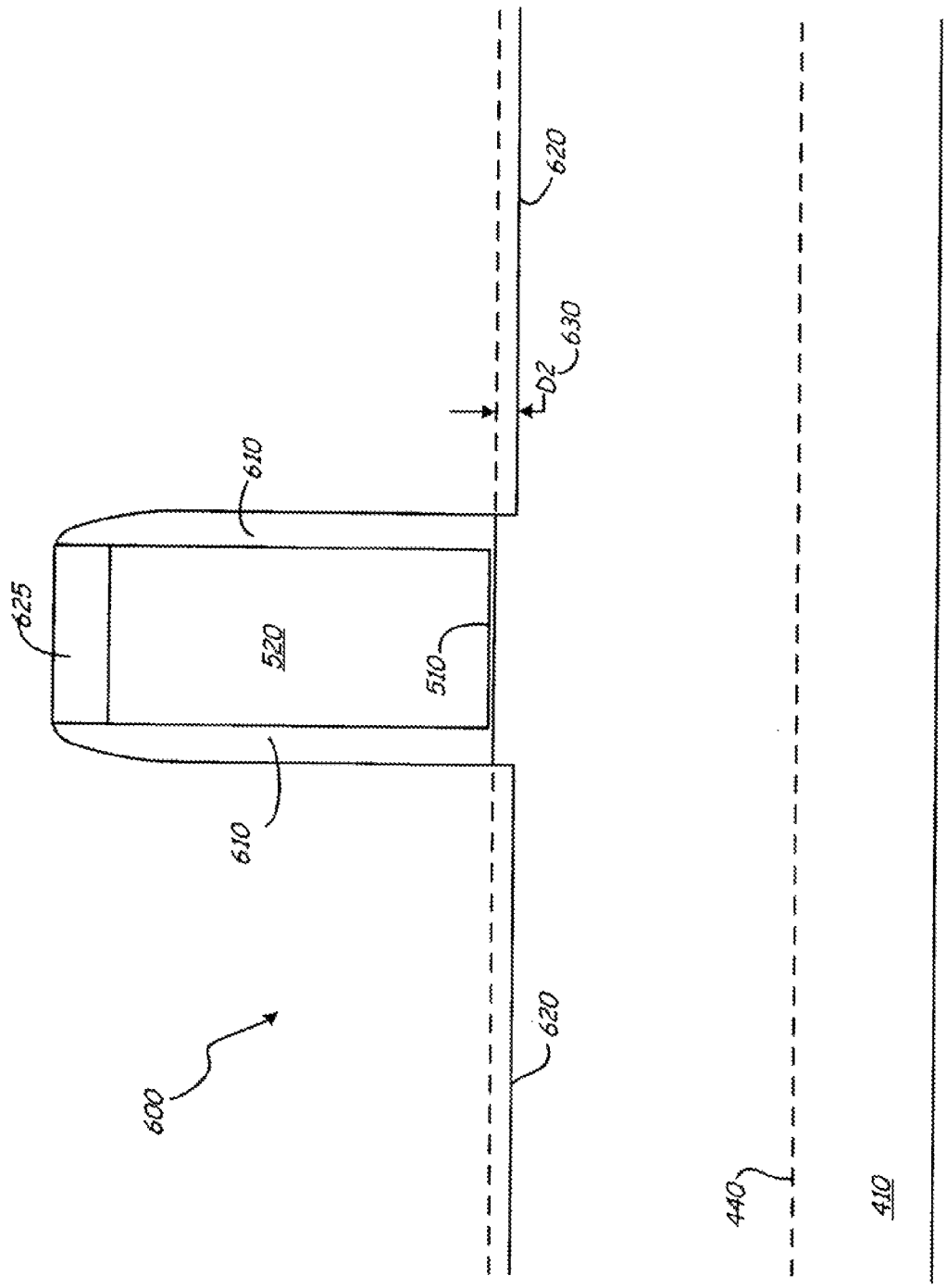
FIG. 6 illustrates an exemplary embodiment of the present invention process using a formation of thin insulator sidewalls, and exposure of the silicon in the gate, source and drain areas.

As shown in FIG. 6, a thin insulator is then provided on the top surface 625 and sidewalls 610 of the silicon gate electrode 520. In one embodiment, the thin insulator is a thermally grown oxide that has a thickness of approximately 50 to 500 Å. In another embodiment, the thermally grown thin oxide is provided by a rapid thermal oxidation (RTO) process having a maximum temperature of 900 to 1200° C. for a dwell time of 0.0 to 60 seconds. One skilled in the art will readily realize that there are many manufacturing methods for providing thin insulator layers such as deposition. One skilled in the art will further realize that other materials may be used for the thin insulator such as nitrides and the insulating layer may be comprised of multiple insulator materials. An anisotropic etch is then used to remove the insulator layer on the horizontal surfaces (and thus expose the silicon 620, 625) thereby exposing the horizontal surface, while preserving the insulator layer on the vertical surfaces. In this way, a sidewall insulator 610 is formed. It will be obvious to one skilled in the art that the gate electrode 520 and the sidewall insulator 610 function as a mask to the anisotropic etch such that the openings in the thin insulator layer on the silicon substrate are proximal with the gate electrode 520. In the embodiment in which the thin insulator is approximately 50 to 500 Å, the openings in the thin insulator layer will be proximal to the gate electrode 520 and located within a lateral distance away from the gate electrode 520 that is approximately 50 to 500 Å. In one exemplary embodiment, the silicon surface 620 is recessed below the bottom of the gate insulator to a depth D2 630 of approximately 1 nm to approximately 5 nm. In the embodiment in which an RTO process is used to provide the sidewall insulator, the dopants both in the gate electrode and in the channel region of the device are electrically activated simultaneously with the sidewall insulator formation, as shown in the process step 600 illustrated in FIG. 6.

Figure 7:
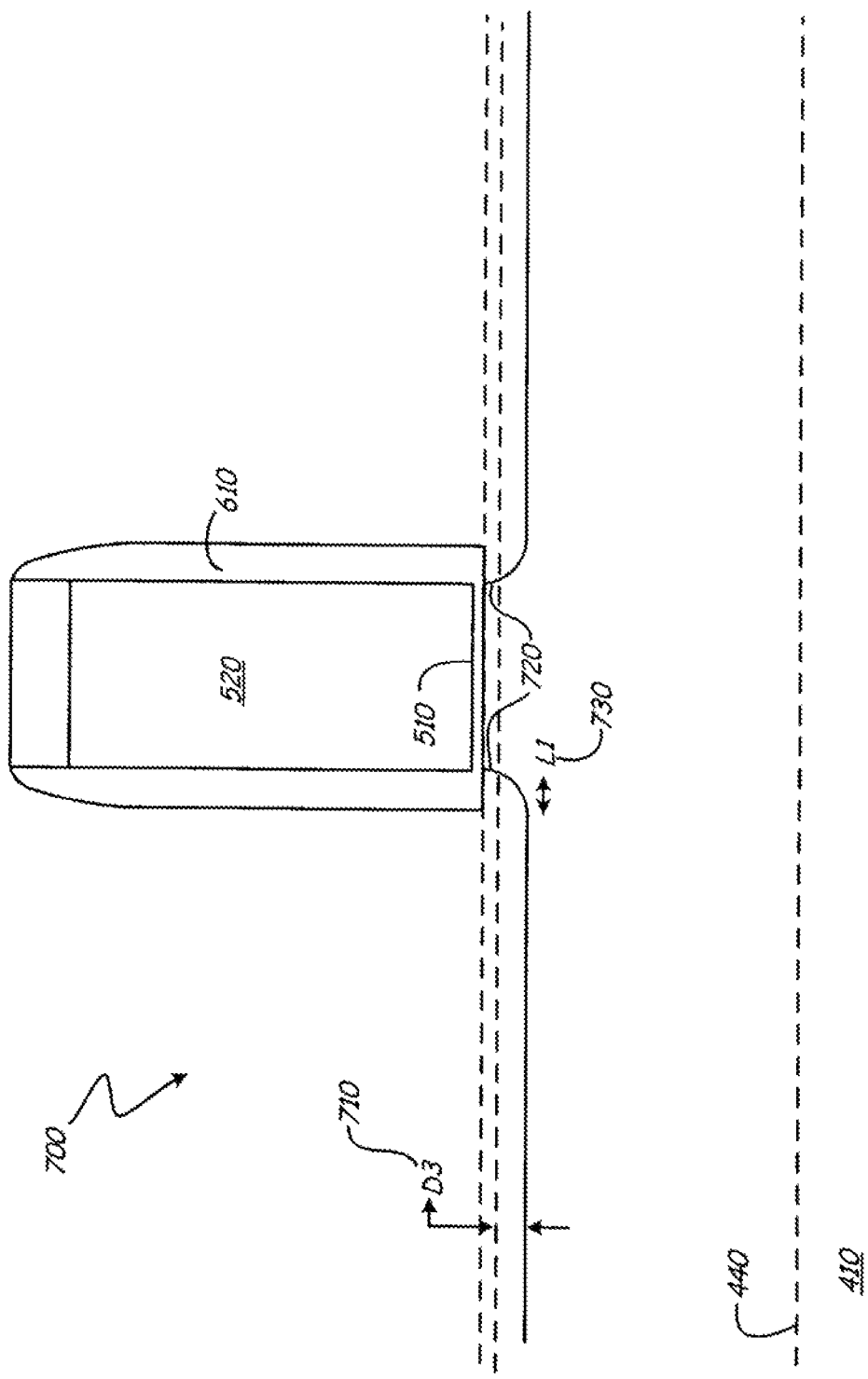
FIG. 7 illustrates an exemplary embodiment of the present invention process using an at least partially isotropic etch.

As shown in FIG. 7, a second etch process step etches the semiconductor substrate both laterally and vertically. This etch is known as a partially isotropic etch. In one embodiment, a partially isotropic etch having a lateral etch rate at least 10% of a vertical etch rate is used. In another embodiment, a partially isotropic etch having a vertical etch rate at least 10% of a lateral etch rate is used. The depth of the second etch is D3 710. The lateral etch displaces the exposed vertical sidewall of the semiconductor substrate 720 laterally a distance L1 730 from the edge of the sidewall oxide 610 to a position below the gate electrode 520. Because the etch is partially isotropic, L1 may be less than or equal to ten times D3 or D3 may be less than or equal to ten times L1. In yet another embodiment, an etch having a lateral etch rate approximately equal to a vertical etch rate is used. For this embodiment, D3 may be approximately equal to L1. The lateral etch provides a means for decreasing the channel length by an amount of approximately two times L1. In one embodiment, the vertical etch rate is sufficient to form an exposed vertical surface 720 of the semiconductor substrate 410 laterally below the gate electrode 520, as shown in the process step 700 illustrated in FIG. 7. In yet a further embodiment, the partially isotropic etch is provided by any one or a combination of a $SF_6$ dry etch, a $HF:HNO_3$ wet etch, or any wet or dry etch that is commonly used for the purpose of etching semiconductor material.

Figure 8:
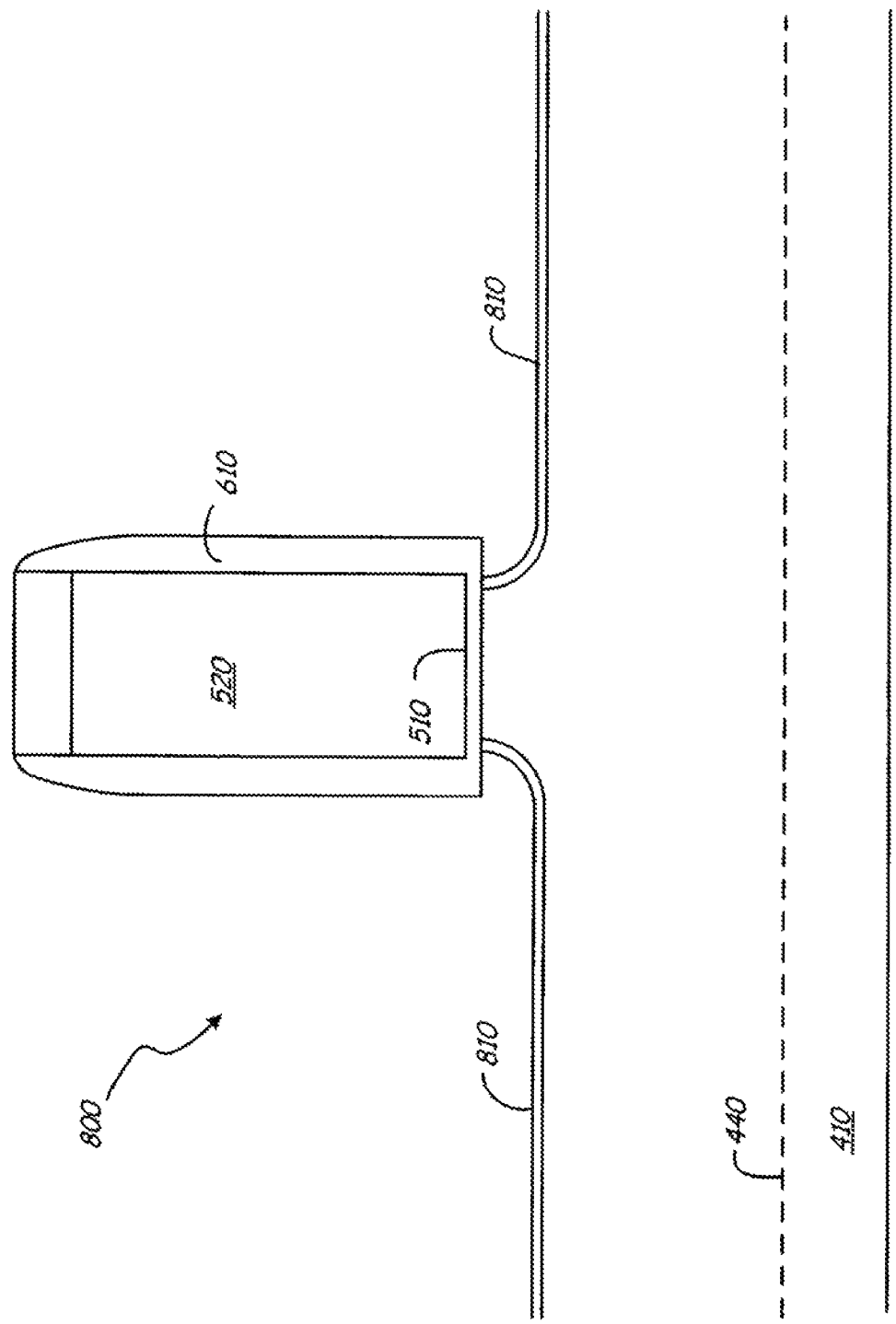
FIG. 8 illustrates an exemplary embodiment of the present invention process using a formation of a thin interfacial layer.

As shown in FIG. 8, an interfacial layer 810 is formed on the exposed horizontal and vertical surfaces of the semiconductor substrate 410. In one embodiment, the interfacial layer 810 is a thermally grown silicon nitride ($Si_3N_4$) having a thickness of less than about 2 nm as shown in the process step 800 illustrated in FIG. 8. In another embodiment, the interfacial layer 810 is comprised of either a metal, semiconductor or insulating material.

Figure 9:
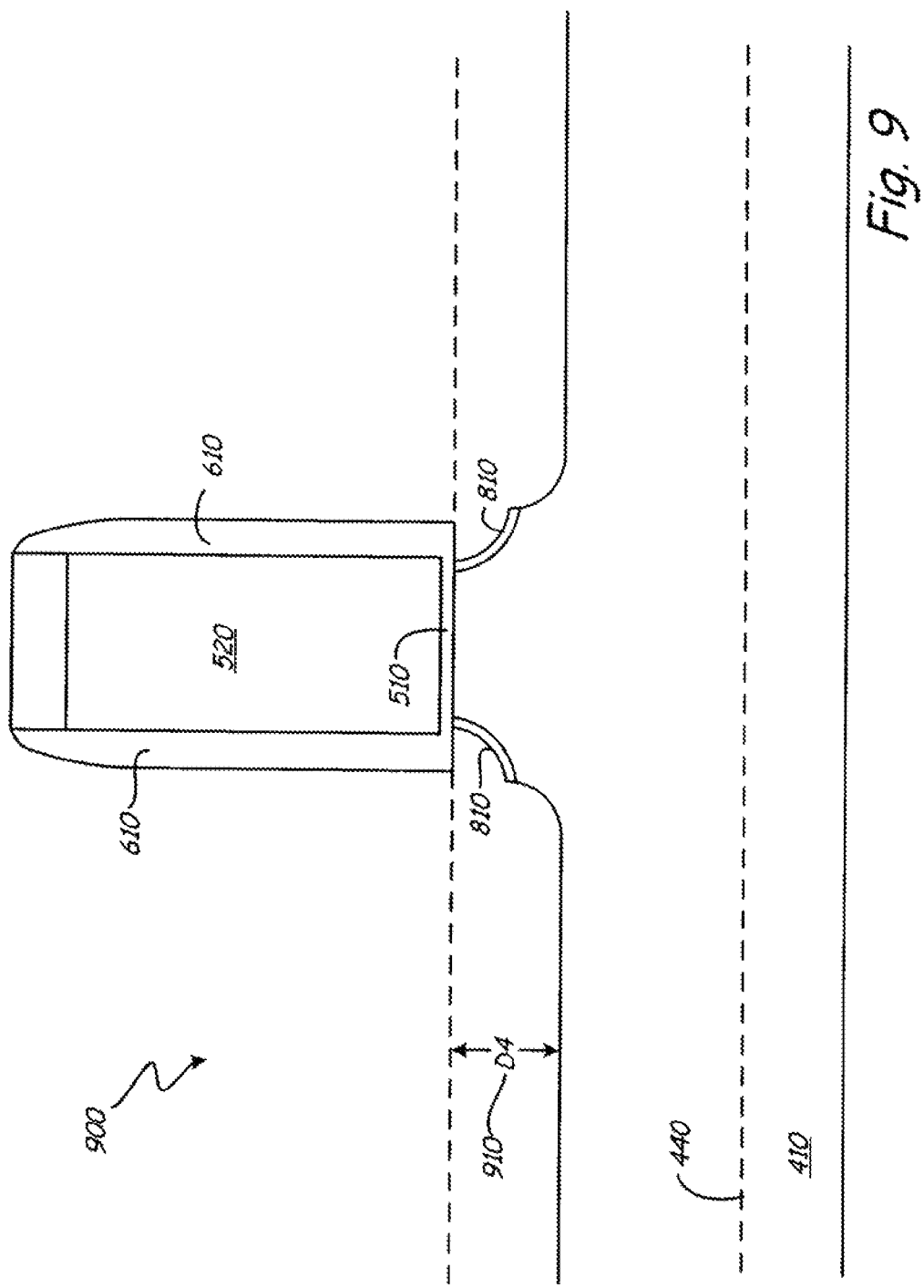
FIG. 9 illustrates an exemplary embodiment of the present invention process using an anisotropic etch.

Process step 900 shown in FIG. 9, provides a third anisotropic etch to etch through the interfacial layer 810 and expose the semiconductor substrate 410, at least in areas proximal but not below the gate electrode 520 and gate electrode sidewall spacer 610. This etch exposes the silicon substrate to a depth D4 (910).

Figure 10:
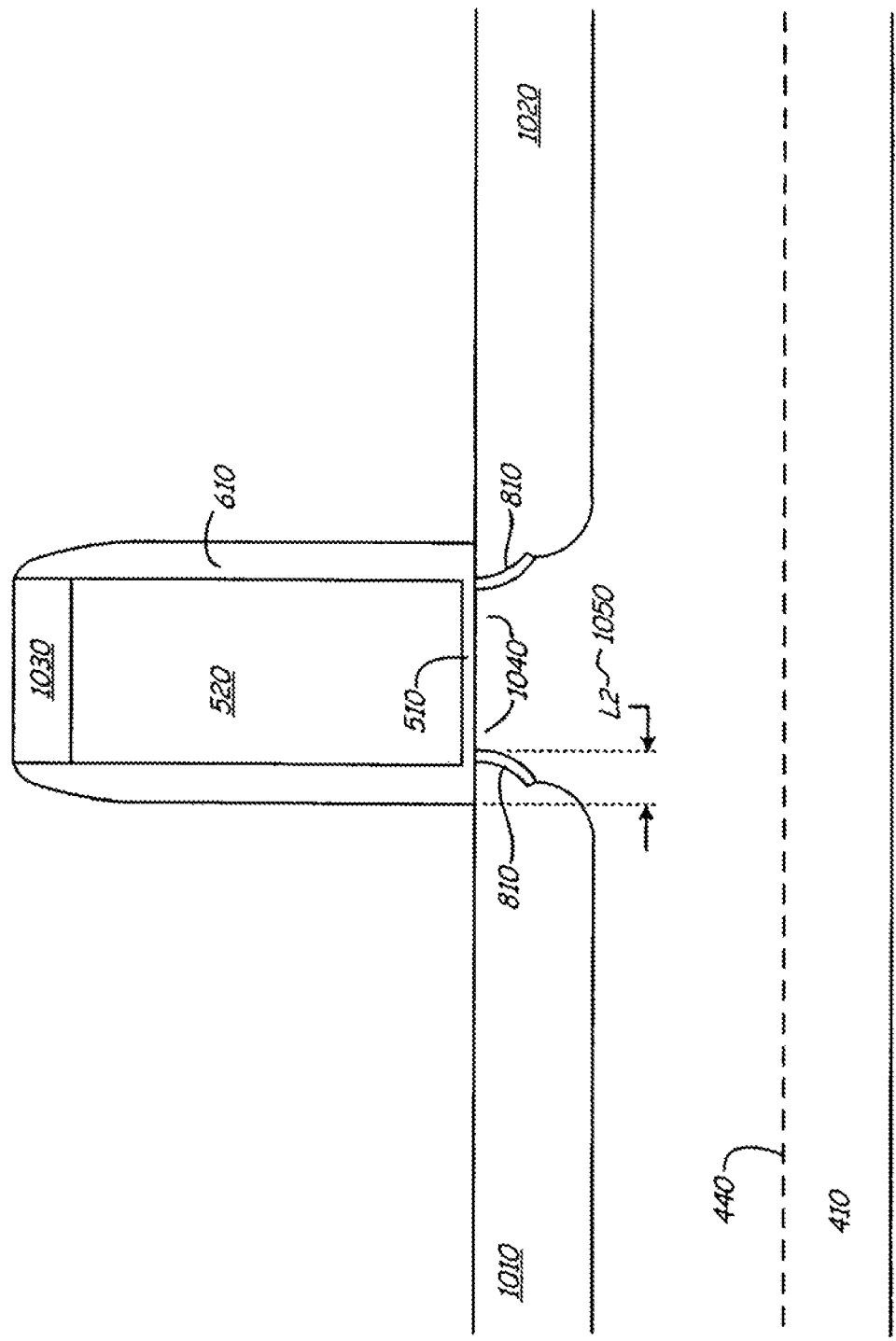
FIG. 10 illustrates an exemplary embodiment of the present invention process using a metal deposition, silicidation anneal, and removal of unreacted metal.

As shown in FIG. 10, the next step encompasses depositing an appropriate metal as a blanket film on all exposed surfaces. Deposition may be provided by either as putter or evaporation process or more generally any thin film formation process. In one embodiment, the substrate is heated during metal deposition to encourage diffusion of the impinging metal atoms to the exposed silicon surface 810, below the gate insulator. In one embodiment, this metal is approximately 250 Å thick but more generally approximately 50 to 1000 Å thick. Throughout the discussion herein there will be examples provided that make reference to Schottky and Schottky-like barriers and contacts in regards to IC fabrication. The present invention does not recognize any limitations in regards to what types of Schottky interfaces may be used in affecting the teachings of the present invention. Thus, the present invention specifically anticipates these types of contacts to be created with any form of conductive material or alloy. For example, for the P-type device, the metal source and drain 1010,1020 may be formed from any one or a combination of Platinum Silicide, Palladium Silicide, or Iridium Silicide. For the N-type device, the metal source and drain 1010,1020 may be formed from a material from the group comprising Rare Earth Silicides such as Erbium Silicide, Dysprosium Silicide or Ytterbium Silicide, or combinations thereof. Any other metals commonly used at the transistor level, such as titanium, cobalt and the like, are specifically anticipated, as well as a plethora of more exotic metals and other alloys. In another embodiment, the silicided source/drain can be made of multiple layers of metal silicide, in which case other exemplary silicides, such as titanium silicide or tungsten silicide for example, may be used.

The wafer is then annealed for a specified time at a specified temperature so that, at all places where the metal is in direct contact with the silicon, a chemical reaction takes place that converts the metal to a metal silicide 1010, 1020, 1030. In one embodiment, for example, the wafer is annealed at about 400° C. for about 45 minutes or more generally approximately 300 to 700° C. for approximately 1 to 120 min. The metal that was in direct contact with a non-silicon surface such as the gate sidewall spacer 610 is left unreacted and thereby unaffected.

A wet chemical etch is then used to remove the unreacted metal while leaving the metal-silicide untouched. In one embodiment, aqua regia is used to remove Platinum and $HNO_3$ is used to remove Erbium. Any other etch chemistries commonly used for the purpose of etching Platinum or Erbium, or any other metal systems used to form Schottky or Schottky-like contacts are specifically anticipated by the present invention. The MIS source-drain SB-MOS device is now complete and ready for electrical contacting to gate 520, source 1010, and drain 1020, as shown in the process step 1000 illustrated in FIG. 10.

As a result of this exemplary process, Schottky or Schottky-like contacts are formed to the channel region 1040 and substrate 410 respectively wherein the Schottky contacts are located at a position controlled by the partially isotropic etch process. In one embodiment, the interface 810 of the source 1010 and drain 1020 electrodes to the channel region 1040 is located laterally below the spacer 610 and is aligned with the edge of the sides of the gate electrodes 1040. In another embodiment, the interface 810 of the source 1010 and drain 1020 electrodes to the channel region 1040 is located laterally below the spacer 610 and partially below the gate electrode 520. In yet another embodiment, a gap is formed between the interface 810 of the source 1010 and drain 1020 electrodes to the channel region 1040 and the edge of the sides of the gate electrode 520.

While traditional Schottky contacts are abrupt, in the present invention an interfacial layer is utilized between the silicon substrate and the metal. This interfacial layer may be ultra-thin, having a thickness of approximately 10 nm or less. Thus, the present invention specifically anticipates Schottky-like contacts and their equivalents to be useful in implementing the present invention. Furthermore, the interfacial layer may comprise materials that have conductive, semi-conductive, or insulator-like properties. For example, ultra-thin interfacial layers of oxide or nitride insulators may be used, or ultra-thin dopant layers formed by dopant segregation techniques may be used, or ultra-thin interfacial layers of a semiconductor such as Germanium may be used to form Schottky-like contacts, among others.

By using the techniques of the present invention, several benefits occur. First, the metal-insulator-semiconductor (MIS) structure provides a means for dynamically controlling the effective Schottky barrier height of the SB-MOS device. Referencing FIG. 11, band diagrams for an exemplary MIS diode device are shown. Basic operating principles and terminology are described in the PhD thesis of Mark Sobolewski, Stanford University, 1989.

Figure 11:
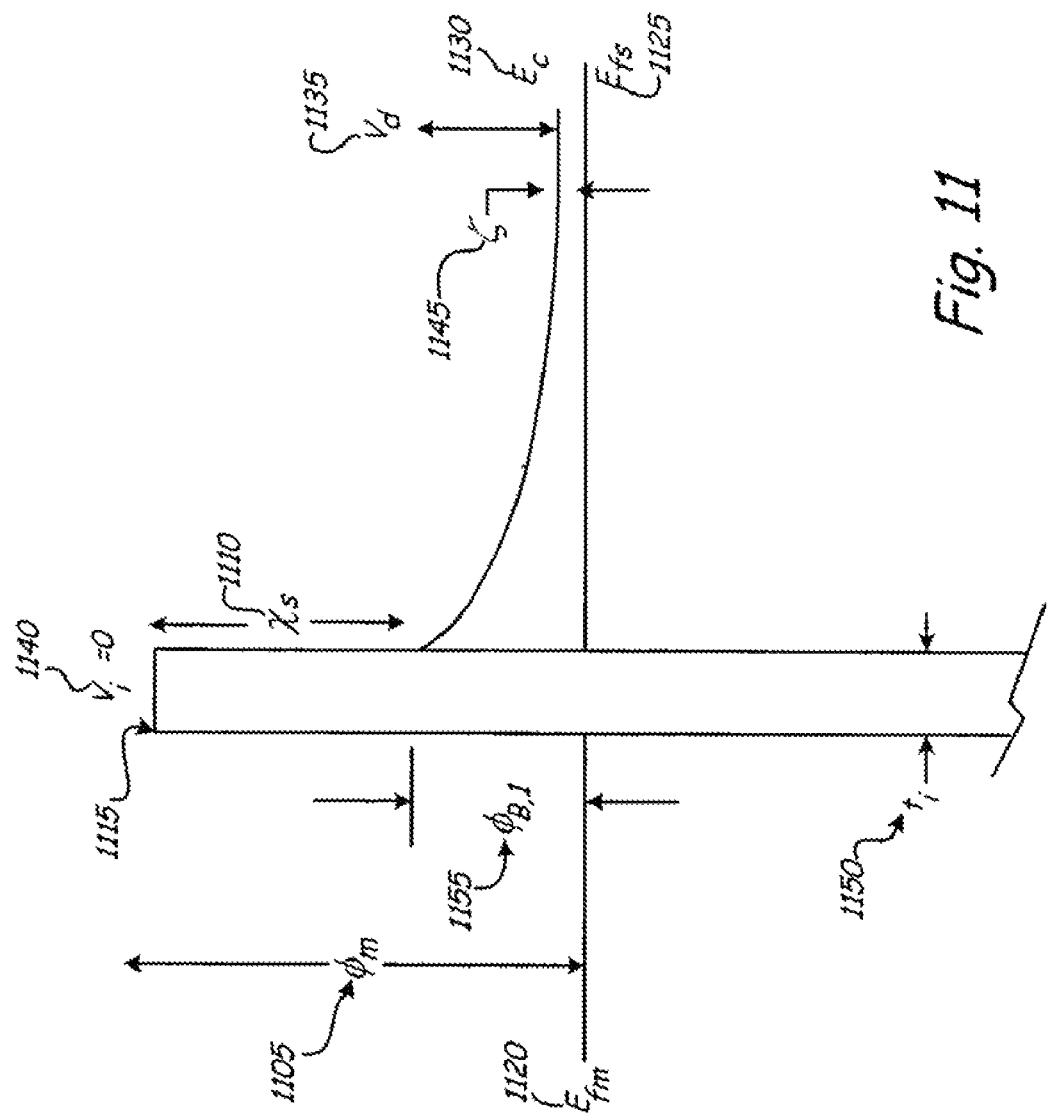
FIG. 11 illustrates band diagrams for an exemplary zero electric field two-terminal MIS diode device.

In FIG. 11, the band diagram for an N-type MIS diode is shown in an idealized zero electric field state. In practice, a finite built-in field may be present in the interfacial insulator layer. The metal work function $\phi_m$ (1105) and semiconductor electron affinity $\chi_s$ (1110) are referenced to the conduction band (1115) of the insulating layer. $E_{fm}$ (1120) and $E_{fs}$ (1125) are the metal and semiconductor Fermi levels respectively, while $E_m$ (1130) is the conduction band. $V_d$ (1135) and $V_i$ (1140) are the potential drops in the semiconductor substrate depletion region and insulator respectively, while $\zeta$ (1145) is the separation between the Fermi level and the conduction band deep in the bulk of the semiconductor. The insulator thickness is $t_i$ (1150) and the effective Schottky barrier height $\phi_{b,1}$ (1155) is defined to be the separation between $E_{fm}$ (1120) and $E_c$ (1130) at the silicon-insulator interface. In the idealized zero electric field state, $\phi_{b,1}$ (1155) is determined by $\phi_m$ (1105) and $\chi_s$ (1110), both physical properties of the system.

$$\phi_{b,1} = \phi_m - \chi_s \qquad \text{Equation 1}$$

Figure 12:
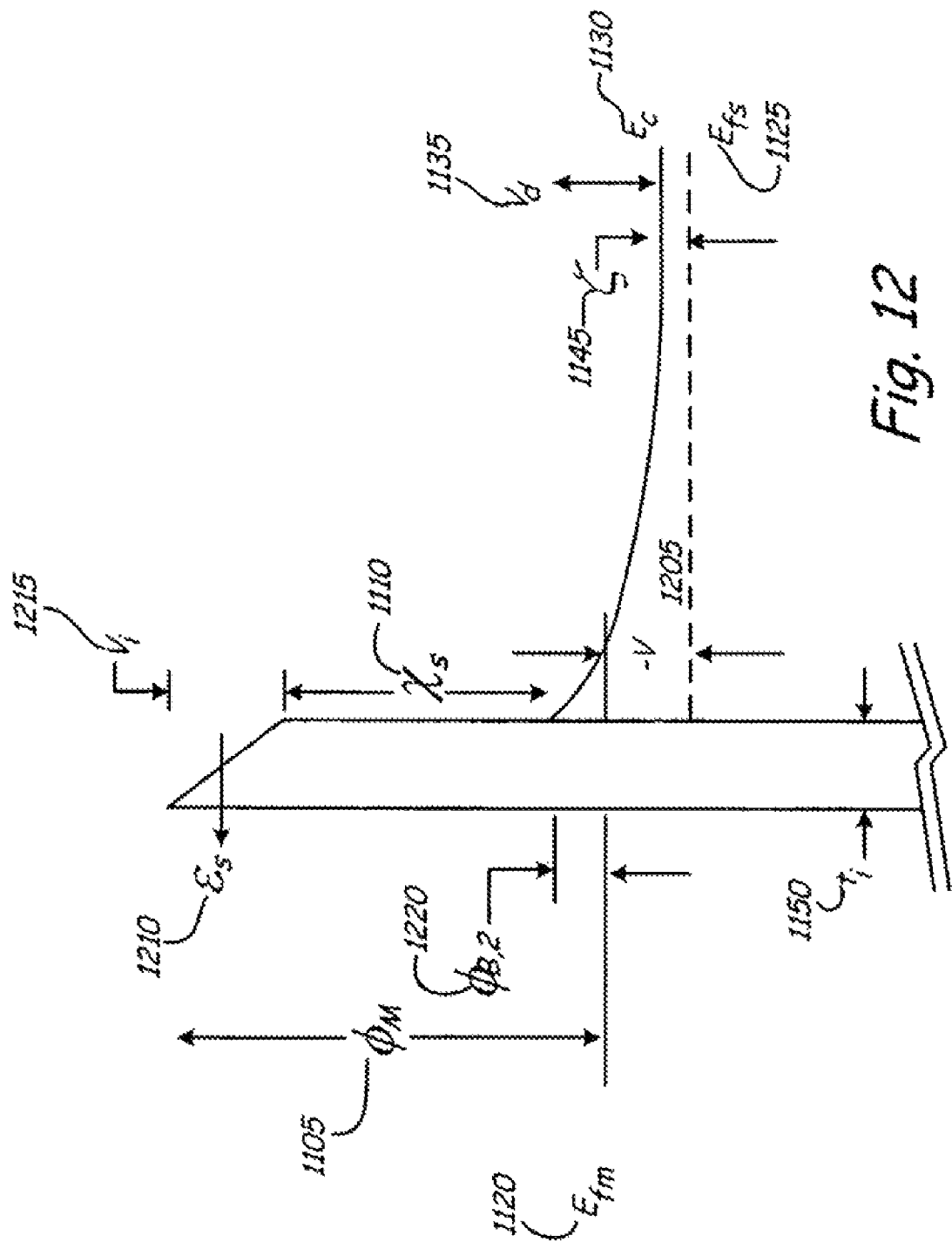
FIG. 12 illustrates band diagrams for an exemplary biased two-terminal MIS diode device.

In FIG. 12, a positive bias is applied to the metal relative to the grounded semiconductor substrate, thereby shifting $E_{fm}$ (1120) up by $-V$ (1205) relative to $E_{fs}$ (1125). This induces an electric field at the interfacial insulator layer $\in_s$ (1210), thereby creating a potential drop $V_i$ (1215) across the insulator. In this state, the new effective Schottky barrier height $\phi_{b,2}$ (1220) is given by Equation 2.

$$\begin{aligned} \phi_{b,2} &= \phi_m - \chi_s - V_i \\ &= \phi_{b,1} - V_i \end{aligned} \qquad \text{Equation 2}$$

Therefore, the potential drop $V_i$ (1215) in the insulator interfacial layer provides a means for dynamically changing the effective Schottky barrier height $\phi_{b,2}$ (1220) between the metal and the semiconductor substrate by an amount $V_i$ (1215). The potential drop in the insulator layer will be a function of the insulator layer thickness $t_i$ (1150), the metal bias 1205 and therefore the electric field strength $\in_s$ 1210 at the insulator, and the insulator dielectric constant.

These principles can be applied to a SB-MOS device having MIS source and drain contacts. When considering the MOSFET operational characteristics, the segment of the MIS source electrode in contact with the channel region and immediately below the gate insulator dominates the device performance, particularly in the on-state. Furthermore, due to the three terminal MOSFET structure, the electrostatic fields in the channel region of the MOSFET have a two-dimensional character. For this reason, the induced Schottky barrier modulation along the interface of the source electrode to the channel region varies, having a maximum where the source intersects the channel and gate insulator. The following discussion references an "active" source MIS region. This is the source MIS structure immediately below the gate insulator, which extends approximately 5-20 nm below the gate insulator along the source-channel junction. It is the region where the gate induced electric field provides the strongest potential drop in the MIS insulator and where approximately over 90% of current emission from the source electrode occurs in the on-state.

In the off-state, with the gate and source contacts grounded and the drain biased at $V_{dd}$, a first electric field will be provided at the insulator of the source MIS structure, causing a first potential drop across the insulator $V_{i,d}$ and therefore a first effective Schottky barrier height $\phi_{bd}$. However, an important difference between a three terminal MIS source-drain MOSFET device of the present invention and a two terminal MIS diode is the third terminal, the gate electrode, which is located in close proximity to the MIS structure at the source. Depending on the MOSFET geometry, the gate electrode may be displaced from the source by approximately 1 nm while the drain electrode is displaced by 10's of nm. In the on-state, the source contact remains grounded while the drain and gate are both biased at $V_{dd}$. Due to the close proximity of the gate to the source, a second electric field, substantially larger than the first electric field, is formed in the active source MIS region, thereby inducing a second potential drop across the insulator $V_{idg}$ and a second effective barrier height $\phi_{bdg}$. Along the vertically oriented portion of the source electrode, adjacent to the channel region, the gate-induced electric field decreases while moving down from the gate insulator, thereby causing $V_{idg}$ to decrease and therefore $\phi_{bdg}$ to increase as a function of position. The Schottky barrier height modulation dramatically affects the current emission characteristics from the source electrode.

Figure 13:
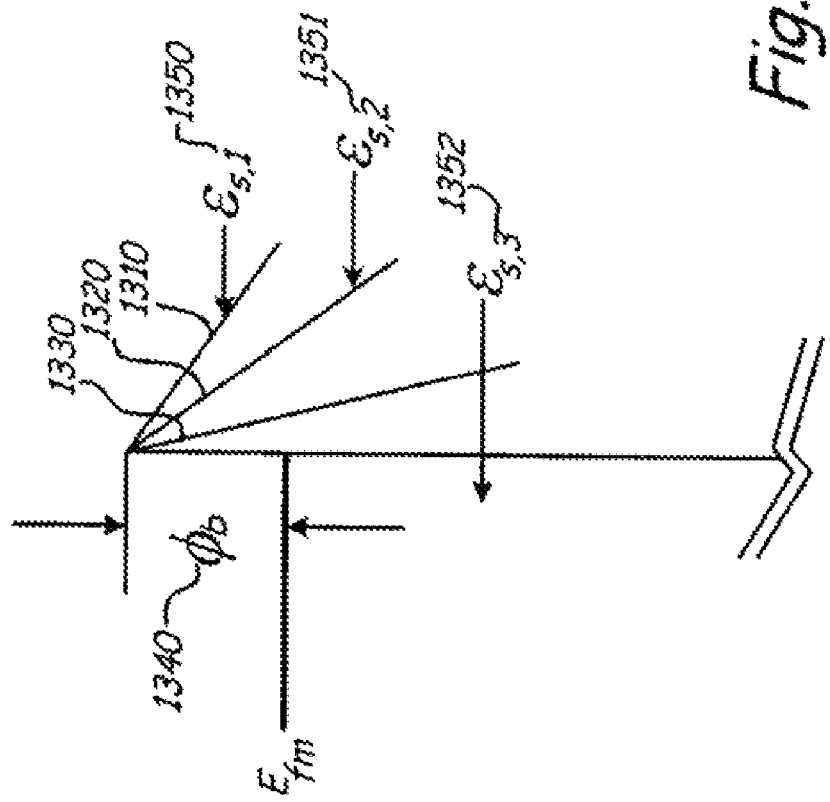
FIG. 13 illustrates band diagrams for different gate bias conditions for the source-channel junction for a SB-MOS device having only metal in the source-drain regions and no interfacial insulator layer.

For SB-MOS technology, current emission from the source electrode is provided by a tunneling mechanism in the on-state. FIG. 13 shows the band diagrams for three different gate biases ($V_g$) at the source-channel interface for a conventional n-type SB-MOS device not having an MIS structure. As shown, in the region near the source electrode, the conduction band forms a nearly triangular barrier 1310, 1320, 1330. The total tunneling current through this Schottky barrier is exponentially sensitive to the barrier height $\phi_b$ 1340 but also the electric field at the Schottky barrier contact Es 1350, 1351, 1352. It is important to note that for this device, the barrier height $\phi_b$ 1340 is fixed, and the gate modulates $\in_s$, 1350, 1351, 1352 thereby increasing the tunneling current as the gate bias is increased.

Figure 14:
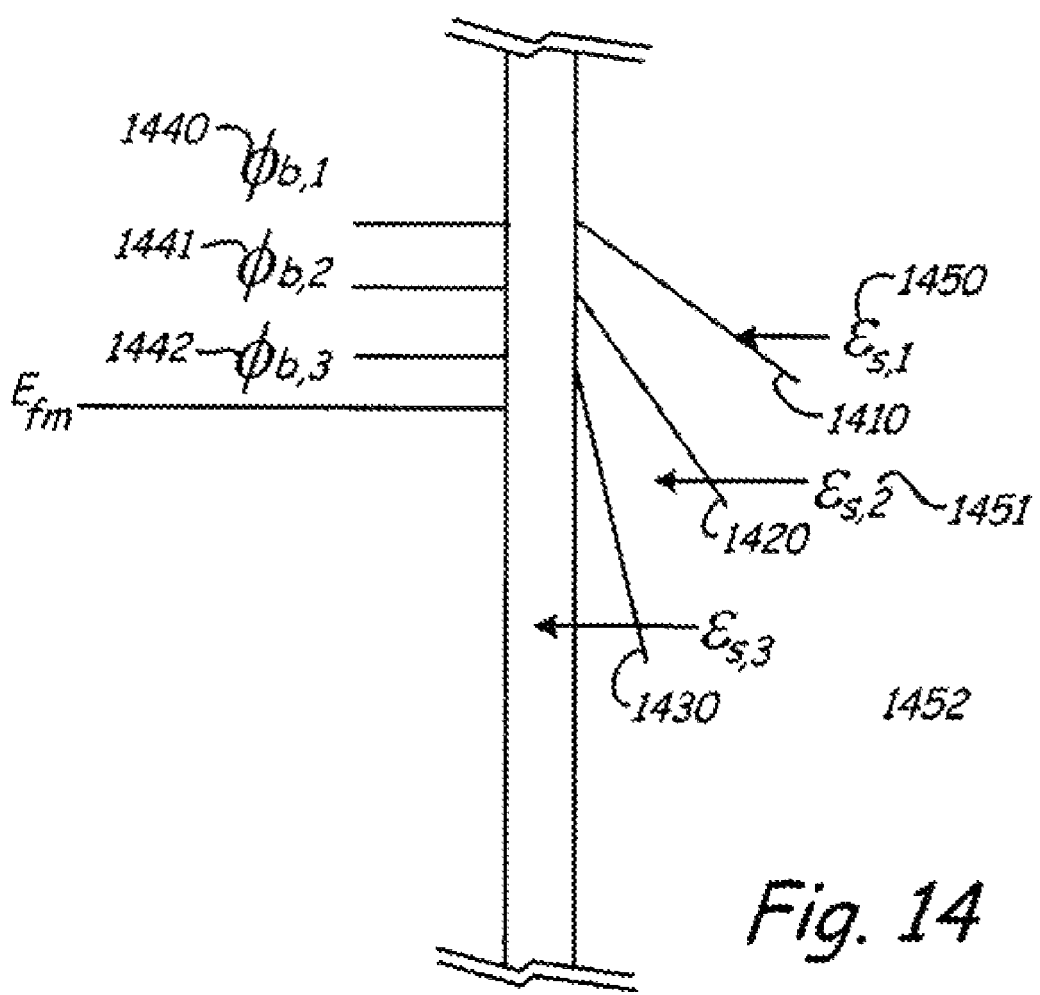
FIG. 14 illustrates band diagrams for different gate bias conditions for the source-channel junction for an exemplary embodiment of the present invention MIS source-drain SB-MOS device.

FIG. 14 shows the band diagrams for three different gate biases $V_g$ at the source-channel interface for an N-type SB-MOS device having an MIS source/drain structure. Only a portion of the bands of the MIS insulator layer are shown. In the region near the source electrode, the conduction band again forms a nearly triangular barrier 1410, 1420, 1430. For a MIS device, the effective barrier height $\phi_b$ 1440, 1441, 1442 is modulated by the gate at the same time $\in_s$ 1450, 1451, 1452 is modulated, thereby providing two mechanisms for increasing the tunneling current, not just one $\in_s$ modulation) as is the case for a conventional SB-MOS device. This effect will occur for any $V_d$ as long as $V_g$ is biased and will thereby provide improved drive current for low $V_d$, reducing the sub-linear turn-on characteristic at low $V_d$ and improving the turn-on performance of the SBMOS device and providing higher drive current.

It is important that the insulator not be too thick, as the charge carrier tunneling probability will eventually be inhibited by the insulator barrier, thereby diminishing the net benefit of modulating the Schottky barrier to a lower level.

An additional benefit of the MIS source-drain SB-MOS device structure is that for a sufficiently thick insulator interfacial layer, it will block the penetration of the metal states, which cause pinning in the silicon (see for example D. Connelly, et. al. in "A New Route to Zero-Barrier Metal Source-Drain MOSFETs" presented at the 2003 VLSI Symposium, Kyoto, 2003). This provides a means for affecting the initial barrier height prior to any gate biasing, and may allow for the introduction of other metals or metal alloys to be used as metal source-drain contacts.

In summary, an interfacial layer disposed between the metal source-drain contacts and the semiconductor substrate of an MIS source/drain SBMOS device provides a means for affecting the unbiased initial effective Schottky barrier height, and furthermore provides a means for dynamically adjusting the Schottky barrier height by changing the gate, and secondarily the drain bias. This enables the introduction of numerous metals, metal silicides and/or metal alloys for affecting the preferred embodiments of the teachings of the present invention, which otherwise would not be possible if employing a pure metal-semiconductor Schottky barrier junction having no interfacial layer. It further enables substantially improved low $V_d$ turn-on characteristics and higher drive currents.

Figure 15:
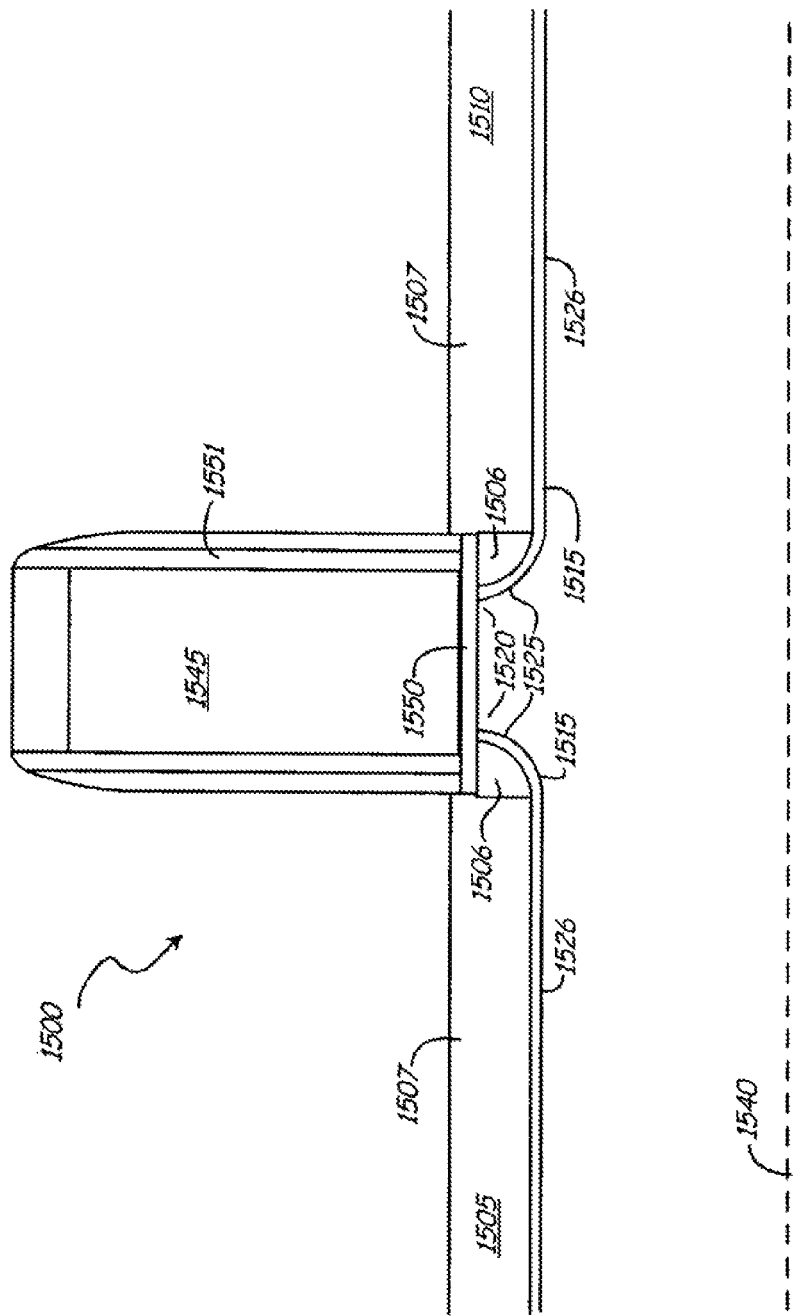
FIG. 15 illustrates an alternative exemplary embodiment of the present invention process using a metal gate.

FIG. 15 shows a cross-sectional view of another preferred exemplary embodiment of the present invention, as exemplified by a metal-insulator-semiconductor (MIS) source-drain SB-MOS structure 1500. This embodiment comprises a SB-MOS device in which at least one of the source 1505 or drain 1510 regions consist of a first 1506 and second 1507 metal, so that there is no doping in the source and/or drain regions. In this embodiment, the device includes an interfacial layer 1515, either conducting, semiconducting, or insulating, placed between the first metal 1506 and the semiconductor substrate 1501, the interfacial layer 1515 being in contact with a channel region 1520, thereby forming a first Schottky barrier or Schottky-like contact 1525 to the channel region 1520. The interfacial layer 1515 is furthermore placed between the second metal 1507 and the semiconductor substrate, thereby forming a second Schottky barrier or Schottky-like contact 1526 to the semiconductor substrate 1501.

The first and second metals may be provided using the following exemplary process. Following process step 800 shown in FIG. 8, a first metal is isotropically deposited, including in any regions below the gate electrode. The first metal is subsequently anisotropically etched. A second metal is then directionally deposited, to minimize deposition on sidewalls of the gate electrode and a short isotropic etch is used to remove any metals deposited on the gate electrode sidewalls or other vertical surfaces. The transistor is masked and a more thorough isotropic etch of the second metal is provided. In one exemplary embodiment, the first metal, located primarily below the gate electrode, is selected for its Schottky barrier height properties to the channel region in order to optimize the drive and/or to optimize the leakage current of the device. In another exemplary embodiment, the second metal, which fills the bulk of the source-drain regions may be chosen based on its conductivity, with high conductivity metals preferred. Furthermore, it may be engineered as an alloy or a stack of metals so that for example it presents a mid-gap barrier between the bulk of the source/drain regions and the semiconductor substrate in order to control off-state leakage for both SB-NMOS and SB-PMOS simultaneously. An alloy or metal stack may also be employed for the second metal for optimizing conductivity or for its process integration properties, such as its ability to provide an etch stop when forming contact holes for the metallization and wiring of the transistor device. The aforementioned selection criteria for the first and second metals apply to this and all other embodiments disclosed previously or subsequently.

The present invention does not recognize any limitations in regards to what types of first or second metals may be used in affecting the teachings of the present invention. Thus, metals commonly used at the transistor level, such as titanium, cobalt and the like, are specifically anticipated, as well as a plethora of more exotic metals and other alloys that provide an appropriate first and second Schottky barrier to optimize device performance. Various metal silicides may also be employed such as Platinum silicide, Palladium silicide, Iridium Silicide, and/or the rare-earth silicides, all of which should be considered as being within the scope of the teachings of the present invention. In another embodiment, the first and second metals are the same and may be provided in the same process step or in two different process steps.

An Indium or Arsenic layer 1540 is used as the channel and substrate dopants for the NMOS or PMOS devices, respectively. Boron may also be used as a channel and substrate dopant for the NMOS device. The gate electrode 1545 is fabricated from Boron or Phosphorous doped polysilicon films for the P-type and N-type devices, respectively. Alternatively, a metal gate may be used. The gate electrode 1545 has a gate insulator 1550 and an electrically insulating sidewall 1551, which may be an oxide, a nitride, or a multi-layer stack of differing insulating materials as shown in device 1500 in FIG. 15.

FIG. 16 shows a cross-sectional view of yet another preferred exemplary embodiment of the present invention, as exemplified by a metal-insulator-semiconductor (MIS) source-drain SB-MOS structure 1600. This embodiment comprises a SB-MOS device in which at least one of the source 1605 or drain 1610 regions consist of a first 1606 and second 1607 metal, so that there is no doping in the source and/or drain regions. In this embodiment, the device includes a first interfacial layer 1615, either conducting, semiconducting, or insulating, placed between the first metal 1606 and the semiconductor substrate 1601, the first interfacial layer 1615 being in contact with a channel region 1620, thereby forming a first Schottky barrier or "Schottky-like" contact 1625 to the channel region 1620. A second thick interfacial layer 1617 is furthermore placed between the second metal 1607 and the semiconductor substrate 1601. The second interfacial layer 1617 may be provided by angled, rotated deposition. The second interfacial layer 1617 is not necessarily composed of the same material or materials of the first interfacial layer 1615. The second interfacial layer provides a large potential barrier to current transport from the second metal to the semiconductor substrate, thereby reducing source-drain leakage current. In another exemplary embodiment, the first and second metals are the same and may be provided in the same process step or in two different process steps.

The second interfacial layer may be provided by a source-drain localized LOCOS process, otherwise called a micro-LOCOS process. Following process step 700 shown in FIG. 7, a thin pad oxide is deposited, followed by deposition of a thicker nitride layer. An anisotropic etch is used to etch through the nitride and pad oxide in the source-drain region, exposing the semiconductor substrate. A thick oxide is thermally grown on the exposed semiconductor substrate and a phosphoric strip removes any exposed nitride layers. A short hydrofluoric acid dip removes the pad oxide on the vertical sidewalls of the channel region, followed by formation of a thin thermally grown nitride layer. An advantage of this present embodiment is it avoids placing a thick insulator on top of the gate electrode, which may be a result of a straight deposited insulator. A first metal is isotropically deposited, including in any regions below the gate electrode and is anisotropically etched. A second metal is directionally deposited, to minimize deposition on sidewalls of the gate electrode and a short isotropic etch is used to remove any metals deposited on the gate electrode sidewalls or other vertical surfaces. The transistor is masked and a more thorough isotropic etch of the second metal is provided. The present invention does not recognize any limitations in regards to what types of first or second metals may be used in affecting the teachings of the present invention. Thus, metals commonly used at the transistor level, such as titanium, cobalt and the like, are specifically anticipated, as well as a plethora of more exotic metals and other alloys that provide an appropriate first Schottky barrier to optimize device performance. Various metal silicides may also be employed, such as Platinum silicide, Palladium silicide, Iridium Silicide, and/or the rare-earth silicides, all of which should be considered as being within the scope of the teachings of the present invention.

An Indium or Arsenic layer 1640 is used as the channel and substrate dopants for the NMOS or PMOS devices, respectively. Boron may also be used for the channel and substrate dopant for the NMOS device. The gate electrode 1645 is fabricated from Boron or Phosphorous doped polysilicon films for the P-type and N-type devices, respectively. Alternatively, a metal gate may be used. The gate electrode 1645 has a gate insulator 1650 and an electrically insulating sidewall 1660, which may be an oxide, a nitride, or a multi-layer stack of differing insulating materials as shown in device 1600 in FIG. 16.

Referencing FIG. 16, in yet another exemplary embodiment, a metal-insulator-semiconductor (MIS) source-drain SB-MOS structure may be employed. In this structure, the first interfacial layer 1615 would not be provided, so that the first metal 1606 is in direct contact with the channel region 1620. To emphasize, no interfacial layer is provided between the first metal 1606 and the channel region 1620. In this embodiment, the first metal layer 1606 may be a metal, an alloy or a silicide. Furthermore, the second metal layer 1607 may be provided using the same methods described above, including for example directional deposition techniques.

FIG. 17 shows a cross-sectional view of yet another preferred exemplary embodiment of the present invention, as exemplified by a metal-insulator-semiconductor (MIS) source-drain SB-MOS structure 1700. This embodiment comprises a SB-MOS device in which the source 1705 and/or drain 1710 regions consist of a first 1706 and optionally a second 1707 metal, so that there is no doping in the source and/or drain regions. In this embodiment, the device includes an interfacial layer 1715, either conducting, semiconducting, or insulating, placed between the first metal 1706 and the semiconductor substrate 1701, the interfacial layer 1715 being in contact with a channel region 1720, thereby forming a first Schottky barrier or "Schottky-like" contact 1725 to the channel region 1720. The source 1705 and drain 1710 regions are in contact with a buried oxide 1717, such as that of an SOI substrate. The buried oxide 1717 provides a large potential barrier to current transport from the second metal 1707 to the semiconductor substrate 1701, thereby reducing source-drain leakage current. In another exemplary embodiment, the first and second metals 1706,1707 are the same and may be provided in the same process step or in two different process steps.

The first and second metals 1706,1707 may be provided using the following exemplary process. Following process step 800 shown in FIG. 8, the first metal 1706 is isotropically deposited, including in any regions below the gate electrode 1745. The first metal 1706 is subsequently anisotropically etched. The second metal 1707 is then directionally deposited, to minimize deposition on sidewalls 1760 of the gate electrode 1745 and a short isotropic etch is used to remove any metals deposited on the gate electrode sidewalls 1760 or other vertical surfaces. The transistor is masked and a more thorough isotropic etch of the second metal 1707 is provided. The first and second metals 1706,1707 are selected based on criteria previously noted. In another embodiment, the first and second metals 1706,1707 are the same and may be provided in the same process step or in two different process steps.

An Indium or Arsenic layer is used as the channel dopants for an NMOS or PMOS devices, respectively. Boron may also be used for the channel and substrate dopant for NMOS. The gate electrode 1745 is fabricated from Boron or Phosphorous doped polysilicon films for the P-type and N-type devices, respectively. Alternatively, a metal gate may be used. The gate electrode 1745 has a gate insulator 1750 and the electrically insulating sidewall 1760, which may be an oxide, a nitride, or a multi-layer stack of differing insulating materials as shown in the structure 1700 in FIG. 17.

Referencing FIG. 17, in yet another exemplary embodiment, a metal-semiconductor (MIS) source-drain SB-MOS structure may be employed. In this structure, the interfacial layer 1715 would not be provided, so that the first metal 1706 is in direct contact with the channel region 1720. To emphasize, no interfacial layer is provided between the first metal 1706 and the channel region 1720. In this embodiment, the first metal layer 1706 may be a metal, an alloy or a silicide. Furthermore, the second metal layer 1707 may be provided using the same methods described above, including for example directional deposition techniques.

The present invention is particularly suitable for use in situations where short channel length MOSFETs are to be fabricated, especially in the range of channel lengths less than 100 nm. However, nothing in the teachings of the present invention limits application of the teachings of the present invention to these short channel length devices. Advantageous use of the teachings of the present invention may be had with channel lengths of any dimension. The present invention further anticipates the use of a plethora of channel, substrate and well implant profiles. For example, the channel implant may be a simple profile whose profile varies significantly in the vertical direction and is generally constant in the lateral direction. Or, for example the channel implant profile may be approximately symmetric, having a lateral maximum concentration in approximately the center of the channel region. Or, laterally and vertically nonuniform doping profiles may be used.

Although the present invention has been described with reference to preferred embodiments, persons skilled in the art will recognize that changes may be made in form and detail without departing from the spirit and scope of the invention. The present invention may be used with any of a number of channel, substrate and well implant profiles. The present invention applies to any use of metal source drain technology, whether it employs SOI substrate, strained Silicon substrate, SiGe substrate, FinFET technology, high K gate insulators, and metal gates. This list is not limitive. Any device for regulating the flow of electric current that employs metal source-drain contacts will have the benefits taught herein.

While, the present invention is particularly suitable for use with SB-MOS semiconductor devices, it may also be applied to other semiconductor devices. Thus, while this specification describes a fabrication process for use with SB-MOS devices, this term should be interpreted broadly to include any device for regulating the flow of electrical current having a conducting channel that has two or more points of electrical contact wherein at least one of the electrical contacts is a Schottky or Schottky-like contact.

We claim:

1. A method of manufacturing a device for regulating a flow of electrical current, the method comprising:
creating exposed areas on a semiconductor substrate in an area proximal to a gate electrode;
etching the exposed areas using an at least partially isotropic etch to create an etched area that extends to an undercut area partially under the gate;
depositing and thermally annealing a film of a first metal with the semiconductor substrate such that a Schottky or Schottky-like source electrode and a Schottky or Schottky-like drain electrode are formed on the undercut area using the first metal;
removing a portion of the first metal that is not in the undercut area;
blanket depositing a film of a second metal on the etched area of the semiconductor substrate;
reacting the second metal such that a continued Schottky or Schottky-like source electrode and a continued Schottky or Schottky-like drain electrode are formed next to the undercut area using the second metal.

2. The method of claim 1, wherein the etching includes using an etch having a lateral etch rate of from approximately one-tenth to ten times of a vertical etch rate.

3. The method of claim 1, wherein the etching includes using an etch having approximately equal lateral and vertical etch rates.

4. The method of claim 1, wherein the etching includes using an etch having lateral and vertical etch rates such that a channel width of the device is reduced by between approximately 1 percent and 50 percent.

5. The method of claim 1, further including heating the semiconductor substrate during the depositing in order to encourage surface diffusion of metal atoms along a surface of the semiconductor substrate.

6. A method of manufacturing a MOSFET device for regulating a flow of electrical current, the method comprising:
providing a gate on a semiconductor substrate;
creating an exposed area on the semiconductor substrate in an area proximal to the gate;
etching the exposed area on the semiconductor substrate to create an etched area that extends to an undercut area partially under the gate;
blanket depositing a film of a first metal on the etched area of the semiconductor substrate;
removing a portion of the first metal that is not in the undercut area;
blanket depositing a film of a second metal on the etched area of the semiconductor substrate;
reacting both the first metal and the second metal with the semiconductor substrate such that a Schottky or Schottky-like source electrode and a Schottky or Schottky-like drain electrode are formed in the undercut area using the first metal, and a continued Schottky or Schottky-like source electrode and a continued Schottky or Schottky-like drain electrode are formed next to the undercut area using the second metal.

7. The method of claim 6, further including heating the semiconductor substrate during the depositing in order to encourage surface diffusion of metal atoms along a surface of the semiconductor substrate under the gate.

8. The method of claim 6, wherein the etching further includes using an etch having lateral and vertical etch rates such that a channel width of the device is reduced by between approximately 1 percent and 50 percent.

9. A method of manufacturing a MOSFET device for regulating a flow of electrical current, the method comprising:
providing a gate on a semiconductor substrate;
creating exposed areas on the semiconductor substrate in an area proximal to the gate;
etching the exposed areas to create etched areas that extend to undercut areas partially under the gate;
depositing a film of a first metal in the etched areas of the semiconductor substrate; and
reacting the first metal with the semiconductor substrate such that a Schottky or Schottky-like source electrode and a Schottky or Schottky-like drain electrode are formed;
wherein the etching includes using an at least partially isotropic etch;
wherein before the reacting the method further includes:
removing a portion of the first metal that is not in the undercut areas, and blanket depositing a second metal on the etched area of the semiconductor substrate; and
wherein the reacting of the first metal further includes reacting the second metal with the semiconductor substrate such that the Schottky or Schottky-like source electrode and the Schottky or Schottky-like drain electrode are formed in the undercut areas using the first metal, and a continued Schottky or Schottky-like source electrode and a continued Schottky or Schottky-like drain electrode are formed next to the undercut areas using the second metal.

10. The method of claim 6, wherein the etching includes using an etch having a lateral etch rate of from approximately one-tenth to ten times of a vertical etch rate.

11. The method of claim 6, wherein the etching includes using an etch having approximately equal lateral and vertical etch rates.

12. The method of claim 6, wherein the providing of the gate-further includes:
providing a thin insulating layer on the semiconductor substrate;
depositing a conducting film on the thin insulating layer;
patterning and etching the conducting film to form a gate electrode; and
forming at least one insulating layer on at least one sidewall of the gate electrode.

13. The method of claim 6, further comprising removing unreacted metal from the MOSFET device after forming the Schottky or Schottky-like source and drain electrodes and the continued Schottky or Schottky-like source and drain electrodes.

14. The method of claim 6, wherein the reacting includes thermal annealing.

15. The method of claim 6, wherein the source electrode and the drain electrode are formed from a member of the group consisting of: Platinum Silicide, Palladium Silicide and Iridium Silicide, and channel dopants in the semiconductor substrate are selected from the group consisting of: Arsenic, Phosphorous, and Antimony.

16. The method of claim 6, wherein the source electrode and the drain electrode are formed from a member of the group consisting of the rare-earth silicides, and channel dopants in the semiconductor substrate are selected from the group consisting of Boron, Indium, and Gallium.

17. The method of claim 6, wherein a Schottky or Schottky-like contact is formed at least in areas adjacent to a channel between the source electrode and the drain electrode.

18. The method of claim 6, wherein an entire surface of the of the source electrode and an entire surface of the drain electrode form a Schottky or Schottky-like contact with the semiconductor substrate.

19. The method of claim 6, wherein before the providing of the gate-the method further includes introducing dopants into the semiconductor substrate, and wherein the introducing of dopants into the semiconductor substrate includes forming a channel dopant concentration that varies significantly in a vertical direction and is generally constant in a lateral direction.

20. The method of claim 6, wherein the Schottky or Schottky-like source electrode and the Schottky or Schottky-like drain electrode are formed of a first conductive material and the continued Schottky or Schottky-like source electrode and the continued Schottky or Schottky-like drain electrode are formed of a second conductive material that is different than the first conductive material.

21. The method of claim 1, wherein the reacting includes thermal annealing.

* * * * *